(12) United States Patent
Liu et al.

(10) Patent No.: US 12,127,328 B2
(45) Date of Patent: Oct. 22, 2024

(54) ELECTRONIC COMPONENT WITH ENCLOSURE FRAME, CIRCUIT BOARD WITH ELECTRONIC COMPONENT, AND ELECTRONIC DEVICE

(71) Applicant: Huawei Digital Power Technologies Co., Ltd., Shenzhen (CN)

(72) Inventors: Yang Liu, Dongguan (CN); Feng Liu, Shenzhen (CN); Biao Hu, Shenzhen (CN); Yuxiu Liu, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 217 days.

(21) Appl. No.: 17/747,810

(22) Filed: May 18, 2022

(65) Prior Publication Data

US 2022/0279643 A1  Sep. 1, 2022

Related U.S. Application Data

(63) Continuation of application No. PCT/CN2019/119297, filed on Nov. 18, 2019.

(51) Int. Cl.
*H05K 7/20* (2006.01)
*H05K 1/02* (2006.01)
(Continued)

(52) U.S. Cl.
CPC .......... *H05K 1/0203* (2013.01); *H05K 1/181* (2013.01); *H05K 5/0247* (2013.01);
(Continued)

(58) Field of Classification Search
CPC .... H05K 1/0203; H05K 1/181; H05K 5/0247; H05K 7/20145; H05K 7/2039; H05K 7/20445
(Continued)

(56) References Cited

U.S. PATENT DOCUMENTS 3,641,474 A * 2/1972 Owens ................ H01L 23/4006
439/573
4,288,839 A * 9/1981 Prager .................. H05K 7/2049
361/717

(Continued)

FOREIGN PATENT DOCUMENTS

CN 206042603 U 3/2017
CN 207706609 U 8/2018
(Continued)

*Primary Examiner* — Anatoly Vortman
(74) *Attorney, Agent, or Firm* — Leydig, Voit & Mayer, Ltd.

(57) ABSTRACT

This application relates to the field of electronic device technologies, and provides an electronic component with an enclosure frame, a circuit board with an electronic component, and an electronic device, to effectively protect the circuit board from being corroded, thereby prolonging a service life of the electronic device. This application is applied to a charging pile for charging a new energy electric vehicle. An electronic component with an enclosure frame includes an enclosure frame and an electronic component. The enclosure frame defines a cavity that is closed or that has one open end; when the electronic component with an enclosure frame is connected to a circuit board, the enclosure frame and the circuit board can define a cavity that is closed or that has one open end.

18 Claims, 24 Drawing Sheets

(51) Int. Cl.
*H05K 1/18* (2006.01)
*H05K 5/02* (2006.01)
(52) U.S. Cl.
CPC ....... *H05K 7/20145* (2013.01); *H05K 7/2039* (2013.01); *H05K 7/20445* (2013.01)
(58) Field of Classification Search
USPC .......................................................... 361/695
See application file for complete search history.

(56) References Cited

U.S. PATENT DOCUMENTS

| | | | | |
|---|---|---|---|---|
| 4,674,005 | A * | 6/1987 | Lacz | H05K 7/209 361/708 |
| 5,184,281 | A * | 2/1993 | Samarov | H05K 7/20509 174/16.3 |
| 5,309,979 | A * | 5/1994 | Brauer | H01L 23/4093 174/16.3 |
| 5,343,362 | A * | 8/1994 | Solberg | H01L 23/4093 257/361 |
| 5,450,284 | A * | 9/1995 | Wekell | H01L 23/4006 257/725 |
| 5,844,312 | A * | 12/1998 | Hinshaw | H01L 23/4093 257/722 |
| 5,909,358 | A * | 6/1999 | Bradt | H01L 23/4093 257/726 |
| 6,088,226 | A * | 7/2000 | Rearick | H01L 23/4006 361/717 |
| 7,468,887 | B2 * | 12/2008 | Han | H05K 7/20963 174/16.3 |
| 7,580,264 | B2 * | 8/2009 | Tanimoto | H01L 23/3672 165/185 |
| 7,663,885 | B2 * | 2/2010 | Ogawa | H01L 23/4006 257/713 |
| 7,715,196 | B2 * | 5/2010 | Chen | H01L 23/4093 165/185 |
| 8,363,408 | B2 * | 1/2013 | Zheng | H05K 7/20918 257/722 |
| 8,670,239 | B2 * | 3/2014 | Hasegawa | H05K 1/0203 361/717 |
| 8,893,770 | B2 * | 11/2014 | Gamborg | H01L 23/4093 361/708 |
| 9,001,513 | B2 * | 4/2015 | Pan | H01L 23/4006 174/15.1 |
| 9,312,201 | B2 * | 4/2016 | Gamborg | H05K 7/20436 |
| 9,313,923 | B2 * | 4/2016 | Davis | H01L 23/4006 |
| 11,043,443 | B2 * | 6/2021 | Kobayashi | H05K 7/2039 |
| 11,083,103 | B2 * | 8/2021 | Hashizume | H05K 7/2039 |
| 11,558,967 | B2 * | 1/2023 | Ookado | H05K 7/209 |
| 2006/0061969 | A1 * | 3/2006 | Nilson | H05K 7/209 361/704 |
| 2007/0091564 | A1 | 4/2007 | Malone et al. | |
| 2012/0103674 | A1 * | 5/2012 | Yu | G11C 29/24 174/261 |
| 2015/0016025 | A1 | 1/2015 | Yanaka et al. | |
| 2016/0057891 | A1 * | 2/2016 | Chang | B23P 15/26 29/890.03 |
| 2019/0348342 | A1 | 11/2019 | Prajuckamol et al. | |
| 2022/0279643 | A1 * | 9/2022 | Liu | H05K 7/20918 |

FOREIGN PATENT DOCUMENTS

| | | |
|---|---|---|
| CN | 208210525 U | 12/2018 |
| CN | 208272839 U | 12/2018 |
| CN | 109952007 A | 6/2019 |
| GB | 2559180 A | 8/2018 |
| WO | 2018138530 A1 | 8/2018 |

* cited by examiner

ELECTRONIC COMPONENT WITH ENCLOSURE FRAME, CIRCUIT BOARD WITH ELECTRONIC COMPONENT, AND ELECTRONIC DEVICE

CROSS-REFERENCE TO RELATED APPLICATIONS

This application is a continuation of International Application No. PCT/CN2019/119297, filed on Nov. 18, 2019, the disclosure of which is hereby incorporated by reference in its entirety.

TECHNICAL FIELD

This application relates to the field of electronic device technologies, and in particular, to an electronic component with an enclosure frame, a circuit board with an electronic component, and an electronic device.

BACKGROUND

Some electronic devices are internally provided with high-power circuit boards used for implementing a specific function, for example, a charging circuit board in a charging pile for charging a new energy electric vehicle. These circuit boards generate a relatively large amount of heat. To prevent the heat from affecting the circuit boards and the electronic devices, heat dissipation processing is usually performed on these circuit boards in an air-cooled heat dissipation manner. However, because an application environment of an electronic device (for example, a charging pile) is relatively complex, there are various types of contaminants such as dust, salt mist, moisture, or corrosive gas. During air-cooled heat dissipation, these contaminants are quite easily adsorbed onto a surface of a circuit board, and a failure of the circuit board is caused due to long-time accumulation or corrosion of these contaminants.

In addition, the circuit board generally includes a circuit board and an electronic component connected to the circuit board. The circuit board includes a first surface and a second surface that deviate from each other, the circuit board is provided with a via, and a pad is disposed at a location that is on the second surface of the circuit board and that corresponds to the via. The electronic component includes an electronic component body and a pin, the electronic component body is located on a side that is of the first surface of the circuit board and that is away from the second surface, and the pin is welded to the pad after penetrating the via in the circuit board. To prevent heat generated when the pin is welded to the pad from affecting the electronic component body, a specific gap needs to be reserved between the electronic component body and the circuit board to extend a heat conduction path between the electronic component body and the pad, thereby reducing impact of the heat generated during welding on the electronic component body. However, in this case, the pin is partially exposed, and is more easily corroded during air-cooled heat dissipation performed on the circuit board.

To avoid the foregoing problem, in a conventional technology, a layer of conformal coating is usually coated on each of a front surface and a back surface of the circuit board through spraying or dip coating, to ensure that a component and a line susceptible to contaminants on the circuit board are completely covered by the conformal coating. However, it is difficult to ensure that the conformal coating is properly coated on some parts, for example, on a surface that is of the electronic component and that protrudes relatively high above a surface of the circuit board: or at a corner. In addition, because a top part of the pin protrudes relatively high above the surface of the circuit board, it is also quite difficult to cover the top part of the pin with the conformal coating to form a protective film.

SUMMARY

Embodiments of this application provide an electronic component with an enclosure frame, a circuit board with an electronic component, and an electronic device, to effectively protect the circuit board from being corroded, thereby prolonging a service life of the electronic device.

According to a first aspect, some embodiments of this application provide an electronic component with an enclosure frame. The electronic component with an enclosure frame includes an enclosure frame and an electronic component. The enclosure frame defines a cavity that is closed or that has one open end: when the electronic component with an enclosure frame is connected to a circuit board, the enclosure frame and the circuit board can define a cavity that is closed or that has one open end: when the electronic component with an enclosure frame is connected to a circuit board, the enclosure frame and another enclosure frame of another electronic component with the another enclosure frame can define a cavity that is closed or that has one open end: or when the electronic component with an enclosure frame is connected to a circuit board, the enclosure frame, the circuit board, and another enclosure frame of another electronic component with the another enclosure frame can define a cavity that is closed or that has one open end. The electronic component includes an electronic component body and a pin, where at least a first end of the electronic component body is located inside the enclosure frame, and the electronic component body is fastened to the enclosure frame: the pin extends out of the electronic component body from the first end of the electronic component body, and extends out of the enclosure frame from a first end of the enclosure frame; and a part that is of the pin and that is located between an end face of the first end of the electronic component body and an end face of the first end of the enclosure frame is located inside the enclosure frame.

Compared with a conventional technology, the electronic component provided in embodiments of this application is provided with the enclosure frame; and the enclosure frame defines a cavity that is closed or that has one open end: when the electronic component with an enclosure frame is connected to the circuit board, the enclosure frame and the circuit board can define a cavity that is closed or that has one open end: when the electronic component with an enclosure frame is connected to the circuit board, the enclosure frame and the enclosure frame of the another electronic component with an enclosure frame can define a cavity that is closed or that has one open end: or when the electronic component with an enclosure frame is connected to the circuit board, the enclosure frame, the circuit board, and the enclosure frame of the another electronic component with an enclosure frame can define a cavity that is closed or that has one open end. Therefore, when the enclosure frame defines a closed cavity, when the enclosure frame and the circuit board define a closed cavity after the electronic component is connected to the circuit board, when the enclosure frame and the enclosure frame of the another electronic component with an enclosure frame define a closed cavity after the electronic component is connected to the circuit board, or when the enclosure frame, the circuit board, and the enclosure frame of the another electronic component with an enclosure frame define a closed cavity after the electronic component is connected to the circuit board, at least the part that is of the pin and that is located between the end face of the first end of the electronic component body and the end face of the first end of the enclosure frame may be sealed by using the cavity: or when the enclosure frame defines a cavity with one open end, when the enclosure frame and the circuit board define a cavity with one open end after the electronic component is connected to the circuit board, when the enclosure frame and the enclosure frame of the another electronic component with an enclosure frame define a cavity with one open end after the electronic component is connected to the circuit board, or when the enclosure frame, the circuit board, and the enclosure frame of the another electronic component with an enclosure frame define a cavity with one open end after the electronic component is connected to the circuit board, a sealant may be filled in the cavity from an opening of the cavity, so that the sealant covers at least the part that is of the pin and that is located between the end face of the first end of the electronic component body and the end face of the first end of the enclosure frame. In this way, the part that is of the pin and that is located between the end face of the first end of the electronic component body and the end face of the first end of the enclosure frame is effectively sealed. When the electronic component with an enclosure frame is connected to the circuit board, the end face of the first end of the enclosure frame may be attached and fastened to a first surface of the circuit board. Therefore, there is no gap between the end face of the first end of the enclosure frame and the first surface of the circuit board, and the pin is not exposed. This can effectively protect a circuit board with an electronic component from being corroded.

Optionally, a wall of the enclosure frame to which the electronic component body is fastened includes a heat sink. In this way, heat generated by the electronic component body can be conducted to the outside of the enclosure frame through the heat sink, and can be further carried away by cold air in an air duct.

Optionally, the heat sink includes one first heat dissipation plate and a plurality of second heat dissipation plates, where the first heat dissipation plate has a first surface and a second surface that deviate from each other, and the electronic component body is fastened to the first surface of the first heat dissipation plate; and the plurality of second heat dissipation plates are thermally connected to the second surface of the first heat dissipation plate, and the plurality of second heat dissipation plates are stacked and are disposed at intervals. In this way, the heat generated by the electronic component body is conducted from the first heat dissipation plate to the plurality of second heat dissipation plates, and is further carried away by the cold air in the air duct.

Optionally, the first heat dissipation plate and the second heat dissipation plates are parallel to a flow direction of the cold air in the air duct. In this way, the cold air in the air duct can pass through surfaces of the first heat dissipation plate and each second heat dissipation plate to carry away heat of the surfaces of the first heat dissipation plate and the second heat dissipation plates as much as possible.

Optionally, the enclosure frame includes a plurality of side walls, the plurality of side walls define a cylindrical structure with two open ends opposite to each other, and a first open end of the cylindrical structure is the first end of the enclosure frame; and the electronic component body is fastened to a side wall, the end face of the first end of the electronic component body faces towards an opening in the first open end of the cylindrical structure, and the pin extends out of the electronic component body from the first end of the electronic component body, and extends out of the enclosure frame from the opening in the first open end of the cylindrical structure. In this way, when the electronic component with an enclosure frame is mounted on the circuit board, the enclosure frame and the circuit board define a cavity with one open end, and a sealant is filled in the cavity, so that the sealant can cover a part that is of the pin and that is located between the end face of the first end of the electronic component body and the first surface of the circuit board. Due to blocking by the enclosure frame, the sealant is accumulated outside a part that is of the pin and that is above the first surface of the circuit board. This can effectively protect the pin from being corroded.

Optionally, the entire electronic component body is located inside the enclosure frame. In this way, after the electronic component with an enclosure frame is mounted on the circuit board, a sealant is filled in the cavity defined by the enclosure frame and the circuit board, so that the sealant can cover the entire electronic component body. This prevents a metal conductive part of the electronic component body from being corroded.

Optionally, the enclosure frame includes a bottom wall and a plurality of side walls fastened to the bottom wall and disposed around an edge of the bottom wall, and an end at which an outer surface of the bottom wall is located is the first end of the enclosure frame; and the electronic component body is fastened to a side wall, the end face of the first end of the electronic component body faces towards the bottom wall, and the pin extends out of the electronic component body from the end face of the first end of the electronic component body, and extends out of the enclosure frame after penetrating the bottom wall. In this way, the enclosure frame defines a cavity with one open end. Before the electronic component with an enclosure frame is connected to the circuit board, a sealant may be filled in the cavity, so that the sealant covers at least a part that is of the pin and that is located between the end face of the first end of the electronic component body and the bottom wall. When the electronic component with an enclosure frame is connected to the circuit board, the end face of the first end of the enclosure frame is attached and fastened to the first surface of the circuit board. Therefore, there is no gap between the end face of the first end of the enclosure frame and the first surface of the circuit board, and the pin is not exposed. This can effectively protect the circuit board with an electronic component from being corroded.

Optionally, the enclosure frame is filled with a sealant, and the sealant covers at least the part that is of the pin and that is located between the end face of the first end of the electronic component body and the bottom wall of the enclosure frame.

Optionally, the entire electronic component body is located inside the enclosure frame. In this way, before the electronic component with an enclosure frame is mounted on the circuit board, the sealant is filled in the cavity defined by the enclosure frame, so that the sealant can cover the entire electronic component body. This prevents a metal conductive part of the electronic component body from being corroded.

Optionally, the enclosure frame includes a bottom wall and a plurality of side walls fastened to the bottom wall and disposed around an edge of the bottom wall, the plurality of side walls include a first side wall, and an end at which an outer surface of the first side wall is located is the first end of the enclosure frame; and the entire electronic component body is located inside the enclosure frame, the electronic component body is fastened to the bottom wall, the end face of the first end of the electronic component body faces towards the first side wall, and the pin extends out of the electronic component body from the end face of the first end of the electronic component body, and extends out of the enclosure frame after penetrating the first side wall. In this way, the enclosure frame defines a cavity with one open end. Therefore, before the electronic component with an enclosure frame is connected to the circuit board, a sealant may be filled in the cavity from an opening of the cavity, so that the sealant covers the electronic component body and a part that is of the pin and that is located between the end face of the first end of the electronic component body and the first side wall. After the sealant is cured, the electronic component with an enclosure frame is connected to the circuit board. In addition, in a process of connecting the electronic component with an enclosure frame to the circuit board, the end face of the first end of the enclosure frame is attached and fastened to the first surface of the circuit board. Therefore, there is no gap between the end face of the first end of the enclosure frame and the first surface of the circuit board, and the pin is not exposed. This can effectively protect the circuit board with an electronic component from being corroded. In some other embodiments, there are an even number of electronic components each with an enclosure frame on the circuit board, and every two of the even number of electronic components each with an enclosure frame form a pair of electronic components. When the electronic component with an enclosure frame is connected to the circuit board, end faces of ends of a plurality of side walls of one electronic component of each pair of electronic components each with an enclosure frame may be disposed opposite to those of the other electronic component thereof in an attachment manner, where all the ends are away from the bottom wall. In this way, end faces of ends of a plurality of side walls of one electronic component of each pair of electronic components each with an enclosure frame are disposed opposite to those of the other electronic component thereof in an attachment manner, to form a sealed housing, where all the ends are away from the bottom wall. The electronic component body and the part that is of the pin and that is located between the end face of the first end of the electronic component body and the first side wall are sealed in the sealed housing. In addition, the first end of the enclosure frame is attached to the first surface of the circuit board to implement sealing. This can effectively protect the pin and the electronic component body from being corroded.

Optionally, the enclosure frame is filled with a sealant, and the sealant covers the electronic component body and the part that is of the pin and that is located between the end face of the first end of the electronic component body and the first side wall.

Optionally, the enclosure frame includes a top wall and a plurality of side walls fastened to the top wall and disposed around an edge of the top wall, ends that are of the plurality of side walls and that are away from the top wall define a first opening, and the ends that are of the plurality of side walls and that are away from the top wall are the first end of the enclosure frame; and the entire electronic component body is located inside the enclosure frame, the electronic component body is fastened to a side wall, the end face of the first end of the electronic component body faces towards the first opening, and the pin extends out of the electronic component body from the end face of the first end of the electronic component body, and extends out of the enclosure frame from the first opening. In this way, when the electronic component with an enclosure frame is mounted on the circuit board, the enclosure frame and the circuit board define a closed cavity, and the electronic component body and a part that is of the pin and that is located between the end face of the first end of the electronic component body and the first surface of the circuit board are sealed in the closed cavity. This can effectively protect the pin and the electronic component body from being corroded.

Optionally, the enclosure frame is filled with a sealant, and the sealant covers the electronic component body and a part that is of the pin and that is located between the end face of the first end of the electronic component body and the first opening. In this way, the electronic component body and the part that is of the pin and that is located between the end face of the first end of the electronic component body and the first opening are covered by the sealant; and after the sealant is cured, the electronic component with an enclosure frame is connected to the circuit board, so that the sealant is attached to the first surface of the circuit board to implement more effective sealing. This further effectively protects the pin from being corroded.

Optionally, the enclosure frame includes a top wall and a plurality of side walls fastened to the top wall and disposed around an edge of the top wall, ends that are of the plurality of side walls and that are away from the top wall define a first opening, one end of the enclosure frame in a direction parallel to the top wall defines a second opening, and the ends that are of the plurality of side walls and that are away from the top wall are the first end of the enclosure frame; and the entire electronic component body is located inside the enclosure frame, the electronic component body is fastened to a side wall, the end face of the first end of the electronic component body faces towards the first opening, and the pin extends out of the electronic component body from the end face of the first end of the electronic component body, and extends out of the enclosure frame from the first opening. In this way, in some embodiments, after the electronic component with an enclosure frame is connected to the circuit board, the enclosure frame and the circuit board define a cavity with one open end, and a sealant is filled in the cavity from an opening of the cavity, so that the sealant covers the electronic component body and a part that is of the pin and that is located between the end face of the first end of the electronic component body and the first surface of the circuit board. In this way, the electronic component body and the part that is of the pin and that is located between the end face of the first end of the electronic component body and the first surface of the circuit board are covered by the sealant; and after the sealant is cured, another electronic component is mounted on the circuit board. This can effectively protect the electronic component body and the pin from being corroded. In some other embodiments, there are an even number of electronic components each with an enclosure frame on the circuit board, every two of the even number of electronic components each with an enclosure frame form a pair of electronic components, and end faces of ends that are of enclosure frames of each pair of electronic components each with an enclosure frame and at which second openings are defined are disposed opposite to each other in an attachment manner. In this way, end faces of ends that are of enclosure frames of each pair of electronic components each with an enclosure frame and at which second openings are defined are disposed opposite to each other in an attachment manner, to form a sealed housing. The electronic component body and the part that is of the pin and that is located between the end face of the first end of the electronic component body and the first surface of the circuit board are sealed in the sealed housing. This can effectively protect the pin and the electronic component body from being corroded.

Optionally, there are a plurality of electronic components, electronic component bodies of the plurality of electronic components are fastened to one wall of the enclosure frame, and pins of the plurality of electronic components all extend out of the enclosure frame from the first end of the enclosure frame. In this way, the pins of the plurality of electronic components can be protected from being corroded by using one enclosure frame, and an area occupied by the enclosure frame on the circuit board is relatively small. This is conducive to small-size design of the circuit board.

Optionally, there are a plurality of electronic components, and the plurality of electronic components include at least one first electronic component and at least one second electronic component; and the plurality of side walls include a first side wall and a second side wall opposite to each other, an electronic component body of the at least one first electronic component is fastened to the first side wall, and an electronic component body of the at least one second electronic component is fastened to the second side wall. In this way, the pins of the plurality of electronic components can be protected from being corroded by using one enclosure frame, and an area occupied by the enclosure frame on the circuit board is relatively small. This is conducive to small-size design of the circuit board.

Optionally, the at least one first electronic component and the at least one second electronic component are disposed opposite to each other.

Optionally, the at least one first electronic component and the at least one second electronic component are disposed in a staggered manner. In this way, each first electronic component is not opposed to any second electronic component, and a width of the enclosure frame in a direction perpendicular to the first side wall or the second side wall can be reduced to further reduce an area occupied by the enclosure frame on the circuit board.

Optionally, a distance between the end face of the first end of the electronic component body and the end face of the first end of the enclosure frame is 3 to 10 mm. In this way, when the electronic component with an enclosure frame is connected to the circuit board, there is a moderate distance between the first end of the electronic component body and the circuit board. This not only can prevent the electronic component body from being damaged by heat generated during pin welding, but also can avoid a case in which small-size design of the circuit board is not facilitated because the electronic component with an enclosure frame protrudes excessively high above a surface of the circuit board.

Optionally, the electronic component is a power transistor.

According to a second aspect, some embodiments of this application provide a circuit board with an electronic component. The circuit board with an electronic component includes a circuit board and the electronic component with an enclosure frame according to any one of the foregoing technical solutions: the circuit board includes a first surface and a second surface that deviate from each other, the circuit board is provided with a via, and a pad is disposed at a location that is on the second surface of the circuit board and that corresponds to the via; and the enclosure frame and an electronic component body of the electronic component are located on one side that is of the first surface of the circuit board and that is away from the second surface of the circuit board, an end face of a first end of the enclosure frame is attached and fastened to the first surface of the circuit board, and a pin of the electronic component is welded to the pad after penetrating the via.

Compared with a conventional technology, the circuit board with an electronic component provided in embodiments of this application includes the electronic component with an enclosure frame in any one of the foregoing technical solutions. Therefore, the circuit board with an electronic component provided in embodiments of this application can resolve a same technical problem and achieve a same expected effect as the electronic component with an enclosure frame in any one of the foregoing technical solutions.

Optionally, the enclosure frame includes a plurality of side walls, the plurality of side walls define a cylindrical structure with two open ends opposite to each other, and a first open end of the cylindrical structure is the first end of the enclosure frame; and the enclosure frame and the circuit board define a cavity with one open end, the cavity is filled with a sealant, and the sealant covers at least a part that is of the pin and that is located between an end face of a first end of the electronic component body and the first surface of the circuit board.

Optionally, the enclosure frame includes a bottom wall and a plurality of side walls fastened to the bottom wall and disposed around an edge of the bottom wall, the plurality of side walls include a first side wall, and an end at which an outer surface of the first side wall is located is the first end of the enclosure frame; and there are an even number of electronic components each with an enclosure frame, every two of the even number of electronic components each with an enclosure frame form a pair of electronic components, and end faces of ends of a plurality of side walls of one electronic component of each pair of electronic components each with an enclosure frame are disposed opposite to those of the other electronic component thereof in an attachment manner, where all the ends are away from the bottom wall.

Optionally, the enclosure frame includes a top wall and a plurality of side walls fastened to the top wall and disposed around an edge of the top wall, ends that are of the plurality of side walls and that are away from the top wall define a first opening, one end of the enclosure frame in a direction parallel to the top wall defines a second opening, and the ends that are of the plurality of side walls and that are away from the top wall are the first end of the enclosure frame; and the enclosure frame and the circuit board define a cavity with one open end, the cavity is filled with a sealant, and the sealant covers the electronic component body and a part that is of the pin and that is located between an end face of a first end of the electronic component body and the first surface of the circuit board.

Optionally, the enclosure frame includes a top wall and a plurality of side walls fastened to the top wall and disposed around an edge of the top wall, ends that are of the plurality of side walls and that are away from the top wall define a first opening, one end of the enclosure frame in a direction parallel to the top wall defines a second opening, and the ends that are of the plurality of side walls and that are away from the top wall are the first end of the enclosure frame; and there are an even number of electronic components each with an enclosure frame, every two of the even number of electronic components each with an enclosure frame form a pair of electronic components, and end faces of ends that are of enclosure frames of each pair of electronic components each with an enclosure frame and at which second openings are defined are disposed opposite to each other in an attachment manner.

Optionally, a first fence is disposed around an edge of at least a partial region of the first surface of the circuit board, the first fence and the first surface of the circuit board define a groove, and the groove is filled with the sealant. In this way, the sealant in the groove can cover another electronic component on the first surface of the circuit board to protect the electronic component from being corroded.

Optionally, a plug-in connector is disposed on the first surface of the circuit board, and the plug-in connector is located inside the first fence; and a second fence is disposed on the first surface of the circuit board and around the plug-in connector, the second fence is located inside the first fence, the first fence, the second fence, and the first surface of the circuit board define a first groove, the first groove is filled with the sealant, the second fence and the first surface of the circuit board define a second groove, and the second groove is not filled with the sealant. In this way, due to blocking by the second fence, the sealant is prevented from overflowing into a jack of the plug-in connector during filling of the sealant in the groove. After a plug-in is connected to the plug-in connector, the sealant can be filled in the second groove to seal a connection gap between the plug-in and the plug-in connector, to protect a metal conductive part in the connection gap between the plug-in and the plug-in connector from being corroded.

Optionally, the circuit board with an electronic component is a charging circuit board in a charging pile for charging a new energy electric vehicle.

According to a third aspect, some embodiments of this application provide an electronic device, including a housing, a cooling fan, and the circuit board with an electronic component according to any one of the foregoing technical solutions, where the housing defines an air duct: the cooling fan is disposed at one end of the air duct; and the circuit board with an electronic component is disposed inside the air duct.

Compared with the conventional technology, the electronic device provided in embodiments of this application includes the circuit board with an electronic component in any one of the foregoing technical solutions, and therefore, the electronic device provided in embodiments of this application can resolve a same technical problem and achieve a same expected effect as the circuit board with an electronic component in any one of the foregoing technical solutions.

Optionally, the housing includes a first side wall; and a second surface of the circuit board is opposite to the first side wall of the housing, a sealing strip is sandwiched between the second surface of the circuit board and the first side wall of the housing, and the sealing strip is disposed around an edge of the second surface of the circuit board. In this way, the first side wall of the housing, the sealing strip, and the second surface of the circuit board define a closed or semi-closed cavity to seal an electronic component on the second surface of the circuit board in the cavity, to protect the electronic component on the second surface of the circuit board from being corroded.

According to a fourth aspect, some embodiments of this application provide an electronic device, including a housing, a cooling fan, and a circuit board with an electronic component. The housing defines an air duct, and the housing includes a first side wall: the cooling fan is disposed at one end of the air duct; and the circuit board with an electronic component is disposed inside the air duct, the circuit board with an electronic component includes a circuit board and an electronic component connected to the circuit board, the circuit board includes a first surface and a second surface that deviate from each other, the second surface of the circuit board is opposite to the first side wall of the housing, a sealing strip is sandwiched between the second surface of the circuit board and the first side wall of the housing, and the sealing strip is disposed around an edge of the second surface of the circuit board.

Compared with a conventional technology, because the sealing strip is sandwiched between the second surface of the circuit board provided in embodiments of this application and the first side wall of the housing, and the sealing strip is disposed around the edge of the second surface of the circuit board, the first side wall of the housing, the sealing strip, and the second surface of the circuit board define a closed or semi-closed cavity. In this way, an electronic component on the second surface of the circuit board can be sealed in the cavity to protect the electronic component on the second surface of the circuit board from being corroded, thereby improving a protection level of the circuit board.

Optionally, a first fence is disposed around an edge of at least a partial region of the first surface of the circuit board, the first fence and the first surface of the circuit board define a groove, and the groove is filled with a sealant. In this way, the sealant in the groove can cover an electronic component on the first surface of the circuit board to protect the electronic component from being corroded.

Optionally, a plug-in connector is disposed on the first surface of the circuit board, and the plug-in connector is located inside the first fence; and a second fence is disposed on the first surface of the circuit board and around the plug-in connector, the second fence is located inside the first fence, the first fence, the second fence, and the first surface of the circuit board define a first groove, the first groove is filled with the sealant, the second fence and the first surface of the circuit board define a second groove, and the second groove is not filled with the sealant. In this way, due to blocking by the second fence, the sealant is prevented from overflowing into a jack of the plug-in connector during filling of the sealant in the groove. After a plug-in is connected to the plug-in connector, the sealant can be filled in the second groove to seal a connection gap between the plug-in and the plug-in connector, to protect a metal conductive part in the connection gap between the plug-in and the plug-in connector from being corroded.

Optionally, the circuit board with an electronic component is a charging circuit board in a charging pile for charging a new energy electric vehicle.

REFERENCE NUMERALS

1: housing: 11: first side wall: 2: cooling fan: 3: circuit board with an electronic component; 31: circuit board: 31a: first surface of the circuit board: 31b: second surface of the circuit board; 32: electronic component: 32a: first electronic component: 32b: second electronic component; 321: electronic component body: 321a: first end of the electronic component body: 322: pin:

33: enclosure frame: 33a: first end of the enclosure frame: 331: first side wall: 3311: first heat dissipation plate: 3312: second heat dissipation plate: 3351: first heat dissipation plate: 3352: second heat dissipation plate: 332: second side wall: 333: third side wall: 334: fourth side wall; 335: bottom wall; 336: top wall: 34: cavity: 34a: first opening: 34b: second opening: 36: sealant: 37: first fence: 38: groove; 381: first groove: 382: second groove: 39: second fence: 100: plug-in connector: 4: air duct: 5: sealing strip: 6: gap; and 7: first fence.

DESCRIPTION OF EMBODIMENTS

Some electronic devices are internally provided with high-power circuit boards used for implementing a specific function, for example, a charging circuit board in a charging pile for charging a new energy electric vehicle. These circuit boards generate a relatively large amount of heat. To prevent the heat from affecting the circuit boards and the electronic devices, heat dissipation processing is usually performed on these circuit boards in an air-cooled heat dissipation manner. However, because an application environment of an electronic device (for example, a charging pile) is relatively complex, there are various types of contaminants such as dust, salt mist, moisture, or corrosive gas. During air-cooled heat dissipation, these contaminants are quite easily adsorbed onto a surface of a circuit board, and a failure of the circuit board is caused due to long-time accumulation or corrosion of these contaminants.

Figure 1:
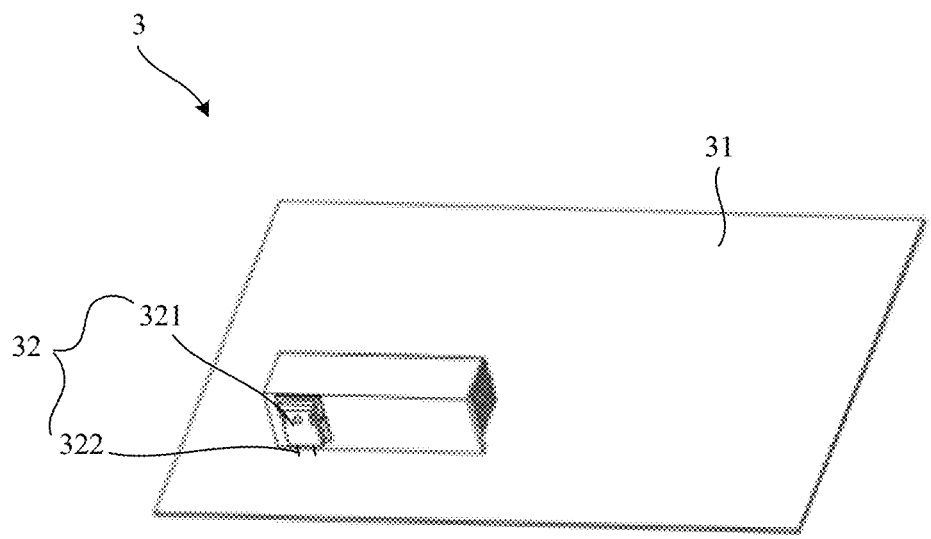
FIG. 1 is a schematic diagram of a structure of a circuit board in a conventional technology.

In addition, FIG. 1 is a schematic diagram of a structure of a circuit board with an electronic component. As shown in FIG. 1, the circuit board 3 with an electronic component includes a circuit board 31 and an electronic component 32 connected to the circuit board 31. The circuit board 31 includes a first surface and a second surface that deviate from each other, the circuit board 31 is provided with a via, and a pad is disposed at a location that is on the second surface of the circuit board 31 and that corresponds the via. The electronic component 32 includes an electronic component body 321 and a pin 322, the electronic component body 321 is located on a side that is of the first surface of the circuit board 31 and that is away from the second surface, and the pin 322 is welded to the pad after penetrating the via in the circuit board 31. To prevent heat generated when the pin 322 is welded to the pad from affecting the electronic component body 321, a specific gap needs to be reserved between the electronic component body 321 and the circuit board 31 to extend a heat conduction path between the electronic component body 321 and the pad, thereby reducing impact of the heat generated during welding on the electronic component body 321. However, in this case, the pin 322 is partially exposed, and is more easily corroded during air-cooled heat dissipation performed on the circuit board 3 with an electronic component.

To avoid the foregoing problem, in a conventional technology, a layer of conformal coating is usually coated on each of a front surface and a back surface of the circuit board 3 with an electronic component through spraying or dip coating, to ensure that a component and a line susceptible to contaminants on the circuit board 3 with an electronic component are completely covered by the conformal coating. However, because the conformal coating has fluidity, the conformal coating cannot stay or be accumulated on the electronic component 32 that protrudes relatively high above a surface of the circuit board 31. In addition, because a top part of the pin 322 of the electronic component 32 protrudes relatively high above the surface of the circuit board 31, it is quite difficult to accumulate the conformal coating on the top part of the pin 322 to form a protective film. Therefore, a protection level of the circuit board 3 is relatively low; and a service life of an electronic device is relatively short.

Figure 2:
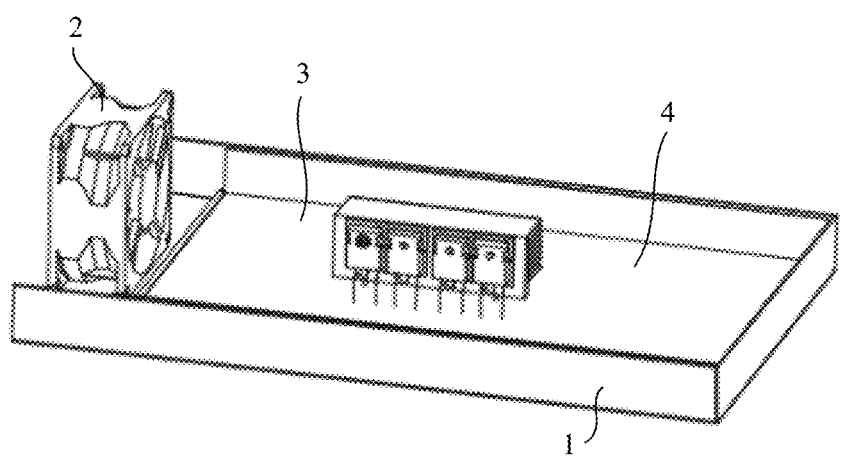
FIG. 2 is a schematic diagram of a structure of a first type of electronic device according to an embodiment of this application.

In view of the foregoing problem, embodiments of this application provide the following two solutions:

First solution: FIG. 2 shows an electronic device according to some embodiments of this application. The electronic device includes, but is not limited to, a charging pile and a wireless base station. As shown in FIG. 2, the electronic device includes a housing 1, a cooling fan 2, and a circuit board 3 with an electronic component. The housing defines an air duct 4: the cooling fan 2 is disposed at one end of the air duct 4; and the circuit board 3 with an electronic component is disposed inside the air duct 4. During running of the cooling fan 2, the cooling fan 2 can blow cold air outside the electronic device into the air duct 4 to cool the circuit board 3 with an electronic component. The housing 1 may be a metal housing, or may be a plastic housing. This is not specifically limited herein. In some embodiments, as shown in FIG. 2, the housing 1 is a metal housing, and the metal housing has relatively high structural strength, relatively high stability, and relatively excellent heat dissipation performance. This can prolong a service life of the electronic device, reduce maintenance costs, and improve heat dissipation performance of the circuit board 3 with an electronic component to some extent. In addition, the cooling fan 2 includes, but is not limited to, an axial flow fan and a centrifugal fan.

Figure 3:
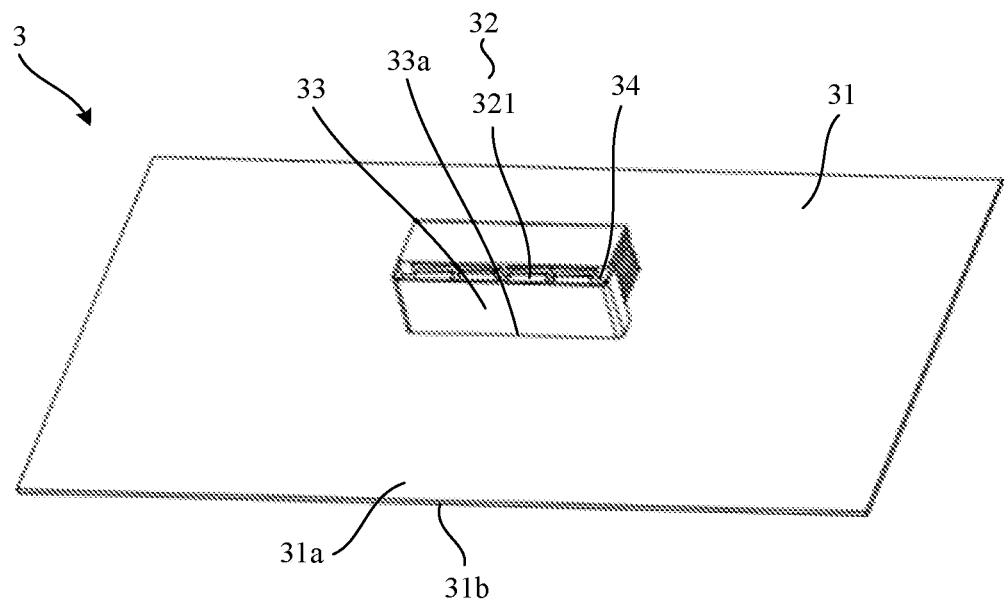
FIG. 3 is a schematic diagram of a structure of a first type of circuit board with an electronic component according to an embodiment of this application.

FIG. 3 shows a circuit board 3 with an electronic component according to some embodiments of this application. As shown in FIG. 3, the circuit board 3 with an electronic component includes a circuit board 31 and an electronic component 32 with an enclosure frame. The circuit board 31 includes a first surface 31a and a second surface 31b that deviate from each other, the circuit board 31 is provided with a via (not shown in the figure), and a pad (not shown in the figure) is disposed at a location that is on the second surface 31b of the circuit board 31 and that corresponds to the via. In some embodiments, the circuit board 3 with an electronic component is a charging circuit board in a charging pile for charging a new energy electric vehicle.

Figure 4:
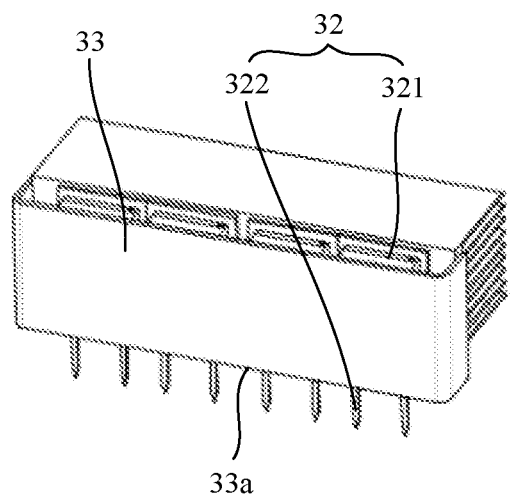
FIG. 4 is a schematic diagram of a structure of a first type of electronic component with an enclosure frame according to an embodiment of this application.
Figure 5:
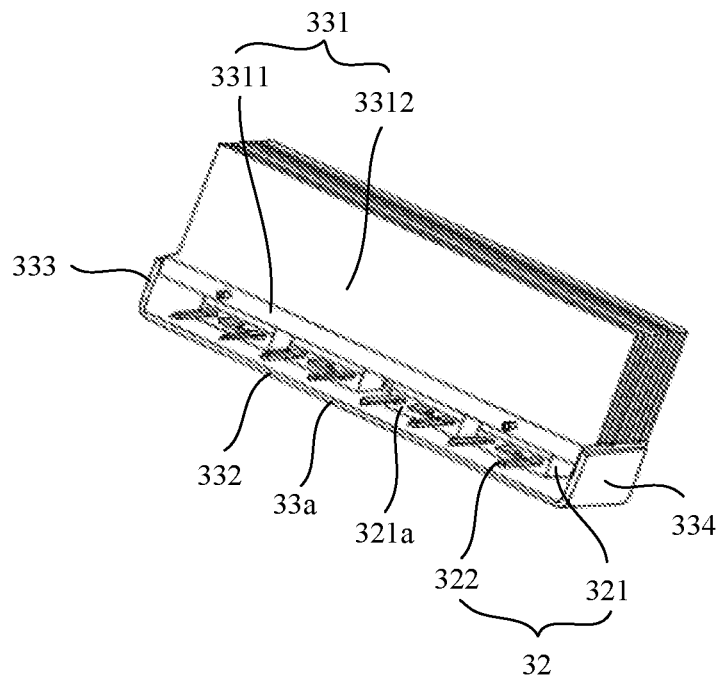
FIG. 5 is a schematic diagram of a structure of the first type of electronic component with an enclosure frame according to an embodiment of this application.

FIG. 4 and FIG. 5 show an electronic component with an enclosure frame according to some embodiments of this application. As shown in FIG. 4, the electronic component 32 with an enclosure frame includes an enclosure frame 33 and an electronic component 32. The enclosure frame 33 defines a cavity that is closed or that has one open end: when the electronic component 32 with an enclosure frame is connected to the circuit board 31 in FIG. 3, the enclosure frame 33 and the circuit board 31 can define a cavity that is closed or that has one open end: when the electronic component 32 with an enclosure frame is connected to the circuit board 31 in FIG. 3, the enclosure frame 33 and an enclosure frame 33 of another electronic component 32 with an enclosure frame can define a cavity that is closed or that has one open end: or when the electronic component 32 with an enclosure frame is connected to the circuit board 31 in FIG. 3, the enclosure frame 33, the circuit board 31, and an enclosure frame 33 of another electronic component 32 with an enclosure frame can define a cavity that is closed or that has one open end. The electronic component 32 includes an electronic component body 321 and a pin 322, at least a first end 321a (as shown in FIG. 5) of the electronic component body 321 is located inside the enclosure frame 33, and the electronic component body 321 is fastened to the enclosure frame 33. As shown in FIG. 5, the pin 322 extends out of the electronic component body 321 from the first end 321a of the electronic component body 321, and extends out of the enclosure frame 33 from a first end 33a of the enclosure frame 33; and a part that is of the pin 322 and that is located between an end face of the first end 321a of the electronic component body 321 and an end face of the first end 33a of the enclosure frame 33 is located inside the enclosure frame 33. In some embodiments, the electronic component 32 is a power transistor. The enclosure frame 33 may be a metal enclosure frame, or may be a plastic enclosure frame. This is not specifically limited herein.

As shown in FIG. 3, an enclosure frame 33 and an electronic component body 321 of the electronic component 32 are located on one side that is of the first surface 31a of the circuit board 31 and that is away from the second surface 31b of the circuit board 31, an end face of a first end 33a of the enclosure frame 33 is attached and fastened to the first surface 31a of the circuit board 31, and a pin of the electronic component 32 is welded to the pad after penetrating the via.

The end face of the first end 33a of the enclosure frame 33 may be fastened to the first surface 31a of the circuit board 31 in a manner such as adhesive bonding, welding, clamping, and threaded connection. This is not specifically limited herein.

Compared with a conventional technology, the electronic component 32 provided in embodiments of this application is provided with the enclosure frame 33; and the enclosure frame 33 defines a cavity that is closed or that has one open end: when the electronic component 32 with an enclosure frame is connected to the circuit board 31 in FIG. 3, the enclosure frame 33 and the circuit board 31 can define a cavity that is closed or that has one open end: when the electronic component 32 with an enclosure frame is connected to the circuit board 31 in FIG. 3, the enclosure frame 33 and the enclosure frame 33 of the another electronic component 32 with an enclosure frame can define a cavity that is closed or that has one open end: or when the electronic component 32 with an enclosure frame is connected to the circuit board 31 in FIG. 3, the enclosure frame 33, the circuit board 31, and the enclosure frame 33 of the another electronic component 32 with an enclosure frame can define a cavity that is closed or that has one open end. Therefore, when the enclosure frame 33 defines a closed cavity, when the enclosure frame 33 and the circuit board 31 define a closed cavity after the electronic component 32 is connected to the circuit board 31, when the enclosure frame 33 and the enclosure frame 33 of the another electronic component 32 with an enclosure frame define a closed cavity after the electronic component 32 is connected to the circuit board 31, or when the enclosure frame 33, the circuit board 31, and the enclosure frame 33 of the another electronic component 32 with an enclosure frame define a closed cavity after the electronic component 32 is connected to the circuit board 31, at least the part that is of the pin 322 and that is located between the end face of the first end of the electronic component body 321 and the end face of the first end 33a of the enclosure frame 33 may be sealed by using the cavity: or when the enclosure frame 33 defines a cavity with one open end, when the enclosure frame 33 and the circuit board 31 define a cavity with one open end after the electronic component 32 is connected to the circuit board 31, when the enclosure frame 33 and the enclosure frame 33 of the another electronic component 32 with an enclosure frame define a cavity with one open end after the electronic component 32 is connected to the circuit board 31, or when the enclosure frame 33, the circuit board 31, and the enclosure frame 33 of the another electronic component 32 with an enclosure frame define a cavity with one open end after the electronic component 32 is connected to the circuit board 31, a sealant may be filled in the cavity from an opening of the cavity, so that the sealant covers at least the part that is of the pin 322 and that is located between the end face of the first end 321a of the electronic component body 321 and the end face of the first end 33a of the enclosure frame 33. In this way, the part that is of the pin 322 and that is located between the end face of the first end 321a of the electronic component body 321 and the end face of the first end 33a of the enclosure frame 33 is effectively sealed. In addition, when the electronic component 32 with an enclosure frame 33 is connected to the circuit board 31, the end face of the first end 33a of the enclosure frame 33 may be attached and fastened to the first surface 31a of the circuit board 31. Therefore, there is no gap between the end face of the first end 33a of the enclosure frame 33 and the first surface 31a of the circuit board 31, and the pin 322 is not exposed. This can effectively protect the circuit board 3 with an electronic component from being corroded.

Compared with a conventional technology, the circuit board 3 with an electronic component provided in embodiments of this application includes the electronic component 32 with an enclosure frame in any one of the foregoing technical solutions. Therefore, the circuit board 3 with an electronic component provided in embodiments of this application can resolve a same technical problem and achieve a same expected effect as the electronic component 32 with an enclosure frame in any one of the foregoing technical solutions.

Compared with a conventional technology, the electronic device provided in embodiments of this application includes the circuit board 3 with an electronic component in any one of the foregoing technical solutions, the electronic device provided in embodiments of this application can resolve a same technical problem and achieve a same expected effect as the circuit board 3 with an electronic component in any one of the foregoing technical solutions.

In some embodiments, as shown in FIG. 5, a distance between the end face of the first end 321a of the electronic component body 321 and the end face of the first end 33a of the enclosure frame 33 is 3 to 10 mm. In this way, when the electronic component 32 with an enclosure frame 33 is connected to the circuit board 31, there is a moderate distance between the first end 321a of the electronic component body 321 and the circuit board 31. This not only can prevent the electronic component body 321 from being damaged by heat generated during pin welding, but also can avoid a case in which small-size design of the circuit board 3 is not facilitated because the electronic component 32 with an enclosure frame 33 protrudes excessively high above a surface of the circuit board 31.

Figure 6:
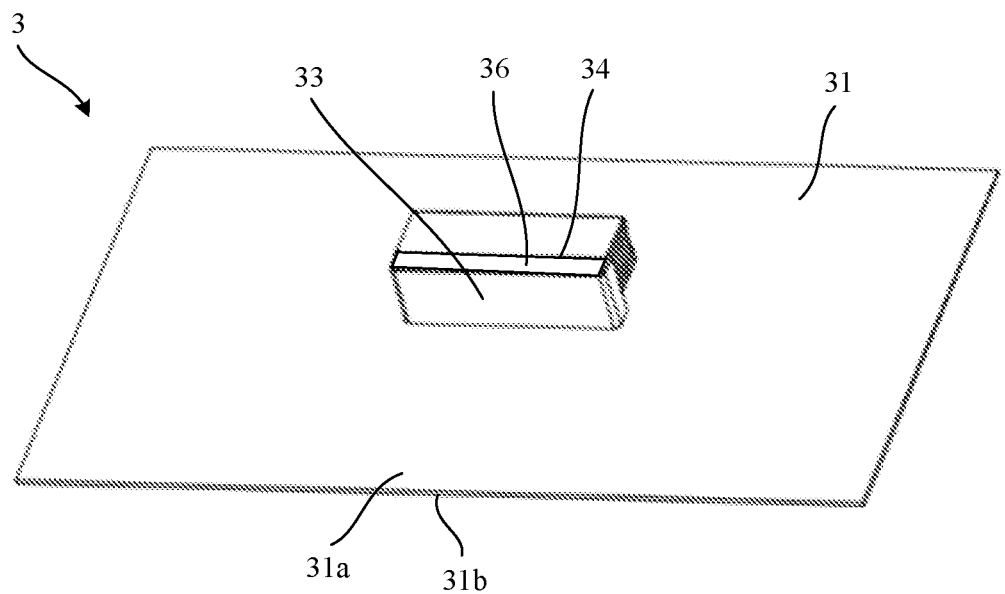
FIG. 6 is a schematic diagram of a structure of a second type of circuit board with an electronic component according to an embodiment of this application.

Specifically, a structural form of the electronic component 32 with an enclosure frame may include the following five optional implementations:

In a first optional implementation, as shown in FIG. 4 and FIG. 5, the electronic component 32 with an enclosure frame 33 includes the enclosure frame 33 and the electronic component 32. The enclosure frame 33 includes a plurality of side walls. For example, the plurality of side walls include a first side wall 331, a second side wall 332, a third side wall 333, and a fourth side wall 334 (as shown in FIG. 5). The plurality of side walls define a cylindrical structure with two open ends opposite to each other, and a first open end of the cylindrical structure is the first end 33a of the enclosure frame 33. The electronic component 32 includes the electronic component body 321 and the pin 322: at least the first end 321a of the electronic component body 321 is located inside the enclosure frame 33; and the electronic component body 321 is fastened to a side wall (for example, the first side wall 331). As shown in FIG. 5, the end face of the first end 321a of the electronic component body 321 faces towards an opening in the first open end (that is, the first end 33a of the enclosure frame 33) of the cylindrical structure, and the pin 322 extends out of the electronic component body 321 from the end face of the first end 321a of the electronic component body 321, and extends out of the enclosure frame 33 from the opening in the first open end (that is, the first end 33a of the enclosure frame 33) of the cylindrical structure. In this way, when the electronic component 32 with an enclosure frame 33 is mounted on the circuit board 31, as shown in FIG. 3, the enclosure frame 33 and the circuit board 31 define a cavity 34 with one open end, and a sealant 36 is filled in the cavity 34. As shown in FIG. 6, the sealant 36 can cover a part that is of the pin 322 and that is located between the end face of the first end 321a of the electronic component body 321 and the first surface 31a of the circuit board 31. Due to blocking by the enclosure frame 33, the sealant is accumulated outside a part that is of the pin 322 and that is above the first surface 31a of the circuit board 31. This can effectively protect the pin 322 from being corroded.

In this embodiment of this application, the sealant 36 includes, but is not limited to, a polyurethane material, a silica gel material, and an asphalt material.

To improve a heat dissipation effect of the electronic component 32, in some embodiments, as shown in FIG. 4 and FIG. 5, a wall (for example, the first side wall 331) of the enclosure frame 33 to which the electronic component body 321 is fastened includes a heat sink. In this way, heat generated by the electronic component body 321 can be conducted to the outside of the enclosure frame 33 through the heat sink, and can be further carried away by cold air in an air duct 4.

The heat sink includes, but is not limited to, a refrigerant-cooled heat sink and a fin heat sink. In some embodiments, as shown in FIG. 5, the heat sink includes one first heat dissipation plate 3311 and a plurality of second heat dissipation plates 3312. The first heat dissipation plate 3311 has a first surface and a second surface that deviate from each other, and the electronic component body 321 is fastened to the first surface of the first heat dissipation plate 3311. The plurality of second heat dissipation plates 3312 are thermally connected to the second surface of the first heat dissipation plate 3311, and the plurality of second heat dissipation plates 3312 are stacked and are disposed at intervals. In this way, the heat generated by the electronic component body 321 is conducted from the first heat dissipation plate 3311 to the plurality of second heat dissipation plates 3312, and is further carried away by the cold air in the air duct 4. To enable the cold air in the air duct 4 to effectively blow away heat of the first heat dissipation plate 3311 and the second heat dissipation plates 3312, in some embodiments, the first heat dissipation plate 3311 and the second heat dissipation plates 3312 should be parallel to a flow direction of the cold air in the air duct 4. In this way, the cold air in the air duct 4 can pass through surfaces of the first heat dissipation plate 3311 and each second heat dissipation plate 3312 to carry away the heat of the surfaces of the first heat dissipation plate 3311 and the second heat dissipation plates 3312 as much as possible.

It should be noted that the plurality of second heat dissipation plates 3312 are thermally connected to the second surface of the first heat dissipation plate 3311, in other words, the plurality of second heat dissipation plates 3312 are connected to the second surface of the first heat dissipation plate 3311, and heat conduction can be performed between the plurality of second heat dissipation plates 3312 and the first heat dissipation plate 3311. The second heat dissipation plates 3312 may be thermally connected to the first heat dissipation plate 3311 in a manner such as thermally conductive adhesive-based bonding or integrated molding. In some embodiments, the plurality of second heat dissipation plates 3312 and the first heat dissipation plate 3311 are integrally molded. In this way, the heat sink includes relatively few components, and has a simple composition structure.

The plurality of second heat dissipation plates 3312 may be perpendicular to the first heat dissipation plate 3311, or may not be perpendicular to the first heat dissipation plate 3311. In some embodiments, as shown in FIG. 5, the plurality of second heat dissipation plates 3312 are perpendicular to the first heat dissipation plate 3311, facilitating positioning between the first heat dissipation plate 3311 and the plurality of second heat dissipation plates 3312.

Materials of the first heat dissipation plate 3311 and the plurality of second heat dissipation plates 3312 include, but are not limited to, aluminum and copper. When surfaces of the electronic component body 321 and the first heat dissipation plate 3311 are not plastic-packaged surfaces, an insulating thermally conductive film or a ceramic substrate needs to be mounted between the electronic component body 321 and the first heat dissipation plate 3311.

In some embodiments, as shown in FIG. 4 and FIG. 5, there are a plurality of electronic components 32, the plurality of side walls of the enclosure frame 33 include a first side wall 331, and electronic component bodies 321 of the plurality of electronic components 32 are fastened to the first side wall 331. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

Figure 7:
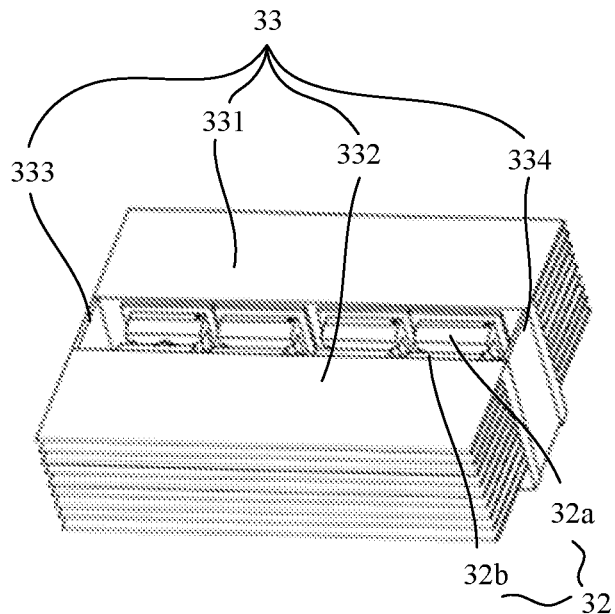
FIG. 7 is a schematic diagram of a structure of a second type of electronic component with an enclosure frame according to an embodiment of this application.

In some other embodiments, as shown in FIG. 7, there are a plurality of electronic components 32, and the plurality of electronic components 32 include at least one first electronic component 32a and at least one second electronic component 32b; and a plurality of side walls of an enclosure frame 33 include a first side wall 331 and a second side wall 332 opposite to each other, an electronic component body of the at least one first electronic component 32a is fastened to the first side wall 331, and an electronic component body of the at least one second electronic component 32b is fastened to the second side wall 332. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

Figure 8:
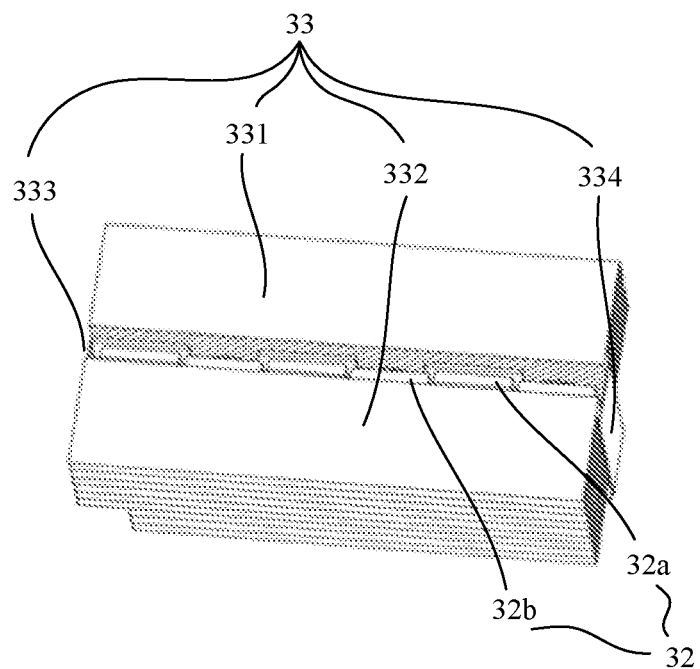
FIG. 8 is a schematic diagram of a structure of a third type of electronic component with an enclosure frame according to an embodiment of this application.

In the foregoing embodiments, the at least one first electronic component 32a and the at least one second electronic component 32b may be disposed opposite to each other, or may be disposed in a staggered manner. This is not specifically limited herein. In some embodiments, as shown in FIG. 7, the at least one first electronic component 32a and the at least one second electronic component 32b are disposed opposite to each other. In some other embodiments, as shown in FIG. 8, the at least one first electronic component 32a and the at least one second electronic component 32b are disposed in a staggered manner. In this way, each first electronic component 32a is not opposite to any second electronic component 32b, and a width of the enclosure frame 33 in a direction perpendicular to the first side wall 331 or the second side wall 332 can be reduced to further reduce an area occupied by the enclosure frame 33 on the circuit board 31.

Only the first end 321a of the electronic component body 321 may be located inside the enclosure frame 33, or the entire electronic component body 321 may be located inside the enclosure frame 33. This is not specifically limited herein. However, in some electronic components 32, electronic component bodies 321 have exposed metal conductive parts. To prevent these metal conductive parts from being corroded, in some embodiments, as shown in FIG. 4 and FIG. 5, the entire electronic component body 321 is located inside the enclosure frame 33. In this way, after the electronic component 32 with an enclosure frame 33 is mounted on the circuit board 31, as shown in FIG. 3, a sealant is filled in the cavity 34 defined by the enclosure frame 33 and the circuit board, so that the sealant can cover the entire electronic component body 321. This prevents a metal conductive part of the electronic component body 321 from being corroded.

Figure 9:
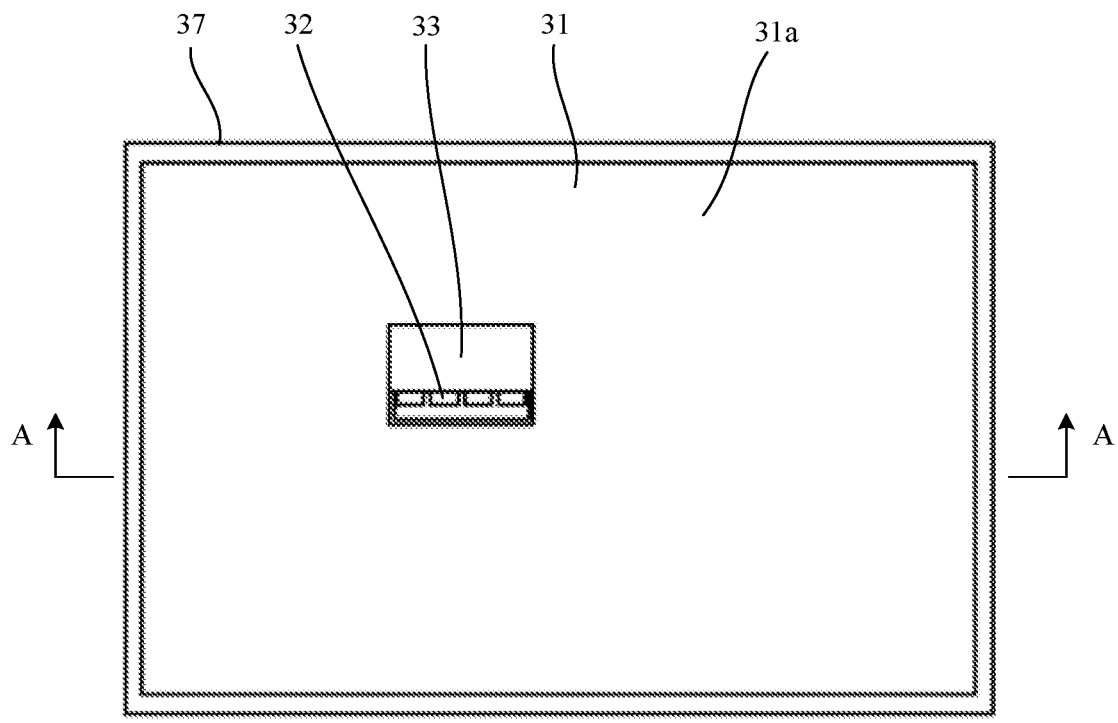
FIG. 9 is a top view of a third type of circuit board with an electronic component according to an embodiment of this application.
Figure 10:
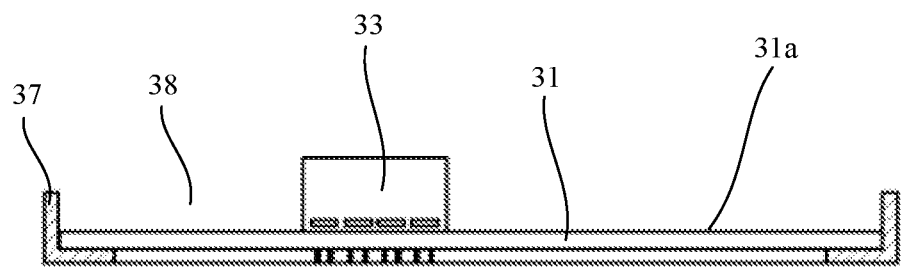
FIG. 10 is a cross-sectional view of the third type of circuit board with an electronic component shown in FIG. 9 along a cross section A-A.
Figure 11:
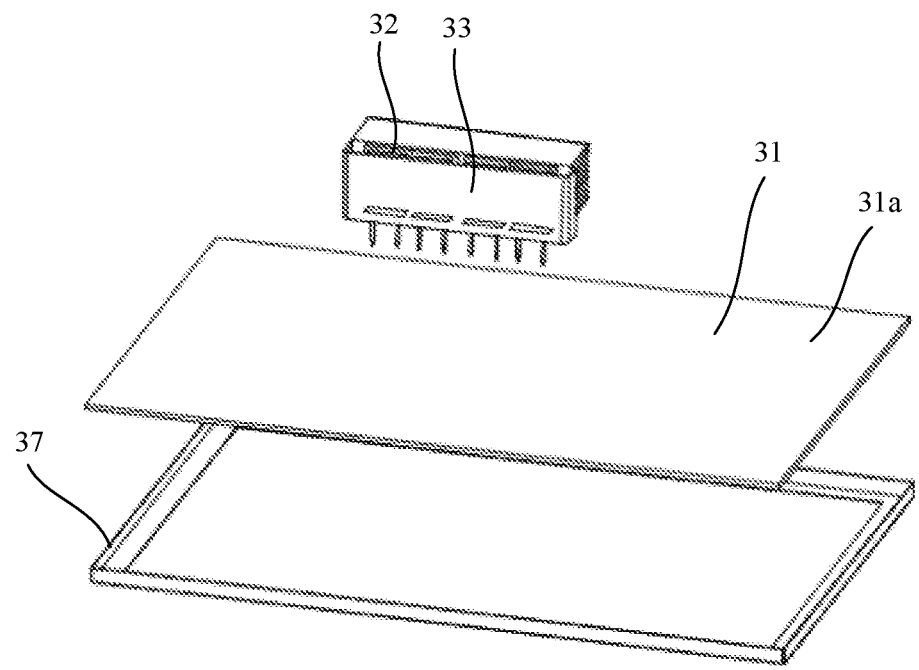
FIG. 11 is an exploded view of the third type of circuit board with an electronic component shown in FIG. 9.

In addition to the electronic component 32 with an enclosure frame 33, another electronic component is disposed on the first surface 31a of the circuit board 31. The another electronic component is connected to the first surface 31a of the circuit board 31 through mounting. To protect the electronic component from being corroded, in some embodiments, as shown in FIG. 9, FIG. 10, and FIG. 11, a first fence 37 is disposed around an edge of at least a partial region of the first surface 31a of the circuit board 31, the first fence 37 and the first surface 31a of the circuit board 31 define a groove 38, and the groove 38 is filled with a sealant. In this way, the another electronic component on the first surface 31a of the circuit board 31 can be covered by the sealant in the groove 38 to protect the electronic component from being corroded.

The first fence 37 may be disposed around an edge of the entire first surface 31a of the circuit board 31, or may be disposed around an edge of a partial region of the first surface 31a of the circuit board 31. This is not specifically limited herein. In some embodiments, as shown in FIG. 9, FIG. 10, and FIG. 11, the first fence 37 is disposed around the edge of the entire first surface 31a of the circuit board 31. In this way, all electronic components on the first surface 31a of the circuit board 31 can be protected from being corroded.

The first fence 37 may be a separately arranged insulating film or a separately arranged plastic part of an open mold, or may be a structure formed by folding an insulating film attached to the housing 1. This is not specifically limited herein.

Figure 12:
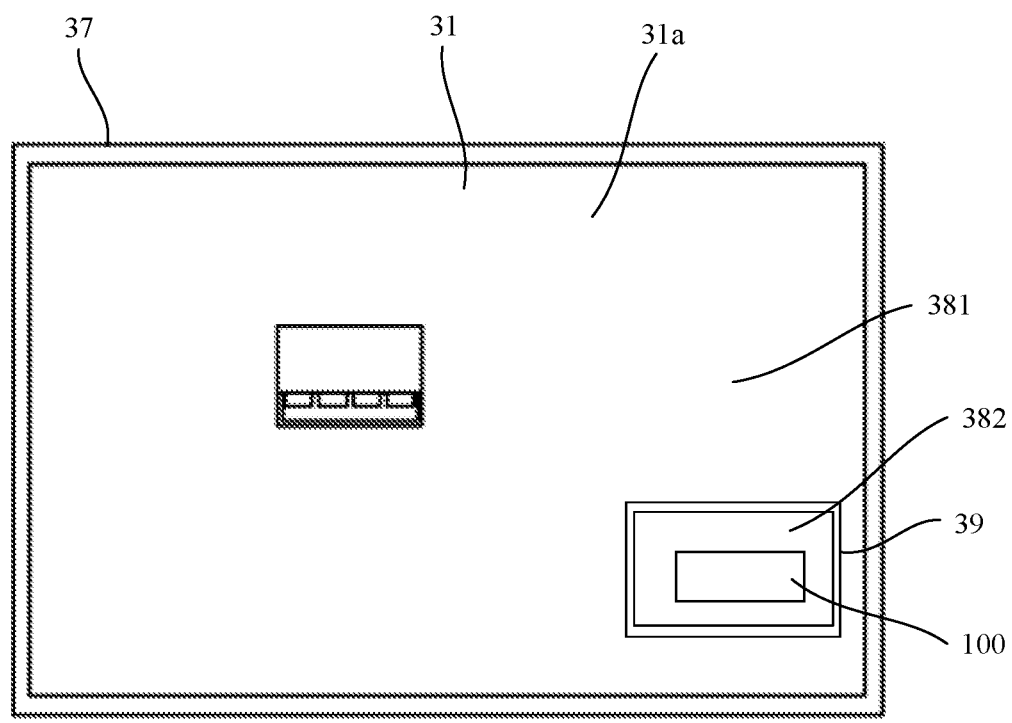
FIG. 12 is a schematic diagram of a structure of a fourth type of circuit board with an electronic component according to an embodiment of this application.

There are plug-in connectors on some circuit boards, and these plug-in connectors are used for external connection of plug-ins. To prevent the sealant from overflowing into a jack of a plug-in connector during filling of the sealant in the groove 38, in some embodiments, as shown in FIG. 12, a plug-in connector 100 is disposed on the first surface 31a of the circuit board 31, and the plug-in connector 100 is located inside the first fence 37. A second fence 39 is disposed on the first surface 31a of the circuit board 31 and around the plug-in connector 100, the second fence 39 is located inside the first fence 37, the first fence 37, the second fence 39, and the first surface 31a of the circuit board 31 define a first groove 381, the first groove 381 is filled with the sealant, the second fence 39 and the first surface 31a of the circuit board 31 define a second groove 382, and the second groove 382 is not filled with the sealant. In this way, due to blocking by the second fence 39, the sealant is prevented from overflowing into a jack of the plug-in connector 100 during filling of the sealant in the groove 38. After a plug-in is connected to the plug-in connector 100, the sealant can be filled in the second groove 382 to seal a connection gap between the plug-in and the plug-in connector 100, to protect a metal conductive part in the connection gap between the plug-in and the plug-in connector 100 from being corroded.

Figure 13:
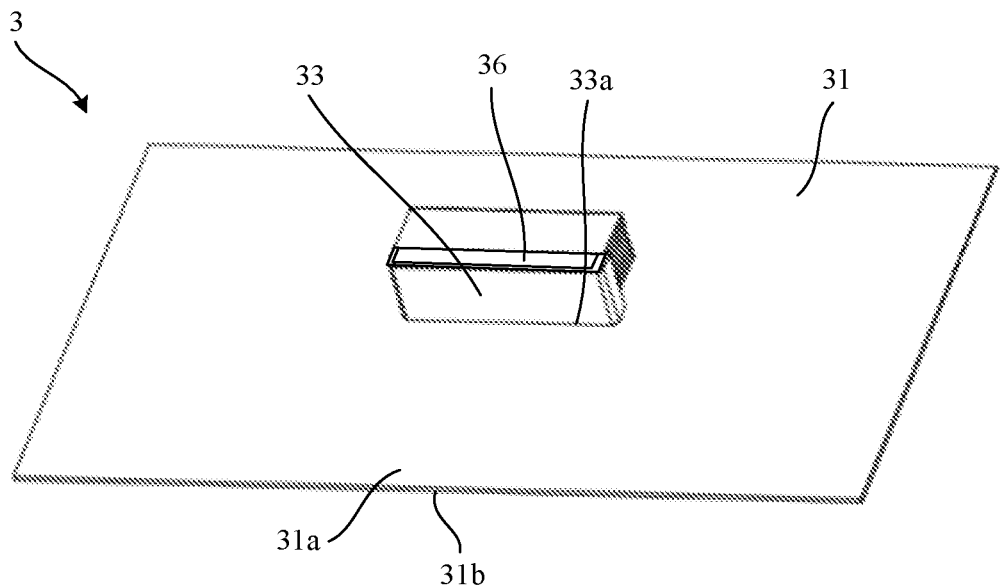
FIG. 13 is a schematic diagram of a structure of a fifth type of circuit board with an electronic component according to an embodiment of this application.
Figure 14:
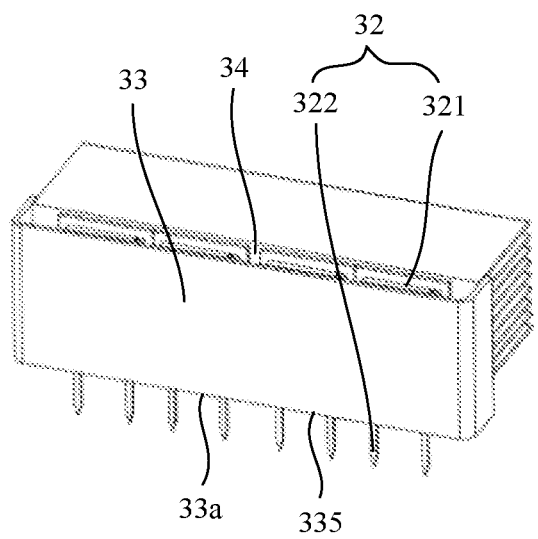
FIG. 14 is a schematic diagram of a structure of a fourth type of electronic component with an enclosure frame according to an embodiment of this application.
Figure 15:
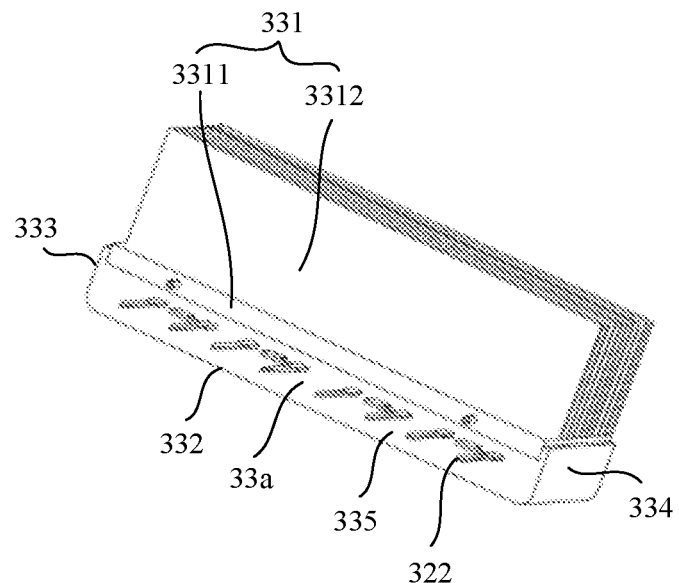
FIG. 15 is a schematic diagram of a structure of the fourth type of electronic component with an enclosure frame according to an embodiment of this application.
Figure 16:
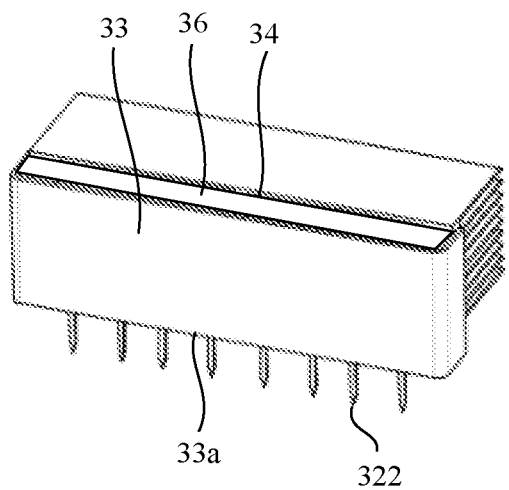
FIG. 16 is a schematic diagram of a structure of a fifth type of electronic component with an enclosure frame according to an embodiment of this application.

In a second optional implementation, as shown in FIG. 14, an electronic component 32 with an enclosure frame 33 includes an enclosure frame 33 and an electronic component 32. As shown in FIG. 15, the enclosure frame 33 includes a bottom wall 335 and a plurality of side walls (for example, the plurality of side walls include a first side wall 331, a second side wall 332, a third side wall 333, and a fourth side wall 334) fastened to the bottom wall 335 and disposed around an edge of the bottom wall 335, and an end at which an outer surface of the bottom wall 335 is located is a first end 33a of the enclosure frame 33. The electronic component 32 includes an electronic component body 321 and a pin 322. At least a first end (not shown in the figure) of the electronic component body 321 is located inside a cavity 34, the electronic component body 321 is fastened to a side wall (for example, the first side wall 331) of the enclosure frame 33, and an end face of the first end of the electronic component body 321 faces towards the bottom wall 335. The pin 322 extends out of the electronic component body 321 from the end face of the first end of the electronic component body 321, and extends out of the enclosure frame 33 after penetrating the bottom wall 335. In this way, as shown in FIG. 14, the enclosure frame 33 defines the cavity 34 with one open end. Before the electronic component 32 with an enclosure frame 33 is connected to a circuit board 31, a sealant may be filled in the cavity 34. FIG. 16 is a schematic diagram of a structure of an electronic component 32 provided with an enclosure frame 33 and filled with a sealant 36. As shown in FIG. 16, a cavity 34 is filled with the sealant 36, and the sealant 36 covers at least a part that is of a pin 322 and that is located between an end face of a first end of an electronic component body 321 and a bottom wall 335. When the electronic component 32 with an enclosure frame 33 is connected to the circuit board 31, as shown in FIG. 13, an end face of the first end 33a of the enclosure frame 33 is attached and fastened to a first surface 31a of the circuit board 31. Therefore, there is no gap between the end face of the first end 33a of the enclosure frame 33 and the first surface 31a of the circuit board 31, and the pin 322 is not exposed. This can effectively protect a circuit board 3 with an electronic component from being corroded.

To improve a heat dissipation effect of the electronic component 32, in some embodiments, as shown in FIG. 14 and FIG. 15, a wall (for example, the first side wall 331) of the enclosure frame 33 to which the electronic component body 321 is fastened includes a heat sink. In this way, heat generated by the electronic component body 321 can be conducted to the outside of the enclosure frame 33 through the heat sink, and can be further carried away by cold air in an air duct 4.

The heat sink includes, but is not limited to, a refrigerant-cooled heat sink and a fin heat sink. In some embodiments, as shown in FIG. 15, the heat sink includes one first heat dissipation plate 3311 and a plurality of second heat dissipation plates 3312. The first heat dissipation plate 3311 has a first surface and a second surface that deviate from each other, and the electronic component body 321 is fastened to the first surface of the first heat dissipation plate 3311. The plurality of second heat dissipation plates 3312 are thermally connected to the second surface of the first heat dissipation plate 3311, and the plurality of second heat dissipation plates 3312 are stacked and are disposed at intervals. In this way, the heat generated by the electronic component body 321 is conducted from the first heat dissipation plate 3311 to the plurality of second heat dissipation plates 3312, and is further carried away by the cold air in the air duct 4. To enable the cold air in the air duct 4 to effectively blow away heat of the first heat dissipation plate 3311 and the second heat dissipation plates 3312, in some embodiments, the first heat dissipation plate 3311 and the second heat dissipation plates 3312 should be parallel to a flow direction of the cold air in the air duct 4. In this way, the cold air in the air duct 4 can pass through surfaces of the first heat dissipation plate 3311 and each second heat dissipation plate 3312 to carry away the heat of the surfaces of the first heat dissipation plate 3311 and the second heat dissipation plates 3312 as much as possible.

It should be noted that the plurality of second heat dissipation plates 3312 are thermally connected to the second surface of the first heat dissipation plate 3311, in other words, the plurality of second heat dissipation plates 3312 are connected to the second surface of the first heat dissipation plate 3311, and heat conduction can be performed between the plurality of second heat dissipation plates 3312 and the first heat dissipation plate 3311. The second heat dissipation plates 3312 may be thermally connected to the first heat dissipation plate 3311 in a manner such as thermally conductive adhesive-based bonding or integrated molding. In some embodiments, the plurality of second heat dissipation plates 3312 and the first heat dissipation plate 3311 are integrally molded. In this way, the heat sink includes relatively few components, and has a simple composition structure.

The plurality of second heat dissipation plates 3312 may be perpendicular to the first heat dissipation plate 3311, or may not be perpendicular to the first heat dissipation plate 3311. This is not specifically limited herein. In some embodiments, as shown in FIG. 15, the plurality of second heat dissipation plates 3312 are perpendicular to the first heat dissipation plate 3311, facilitating positioning between the first heat dissipation plate 3311 and the plurality of second heat dissipation plates 3312.

Materials of the first heat dissipation plate 3311 and the plurality of second heat dissipation plates 3312 include, but are not limited to, aluminum and copper. When surfaces of the electronic component body 321 and the first heat dissipation plate 3311 are not plastic-packaged surfaces, an insulating thermally conductive film or a ceramic substrate needs to be mounted between the electronic component body 321 and the first heat dissipation plate 3311.

In some embodiments, as shown in FIG. 14 and FIG. 15, there are a plurality of electronic components 32, the plurality of side walls of the enclosure frame 33 include a first side wall 331, and electronic component bodies 321 of the plurality of electronic components 32 are fastened to the first side wall 331. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

Figure 17:
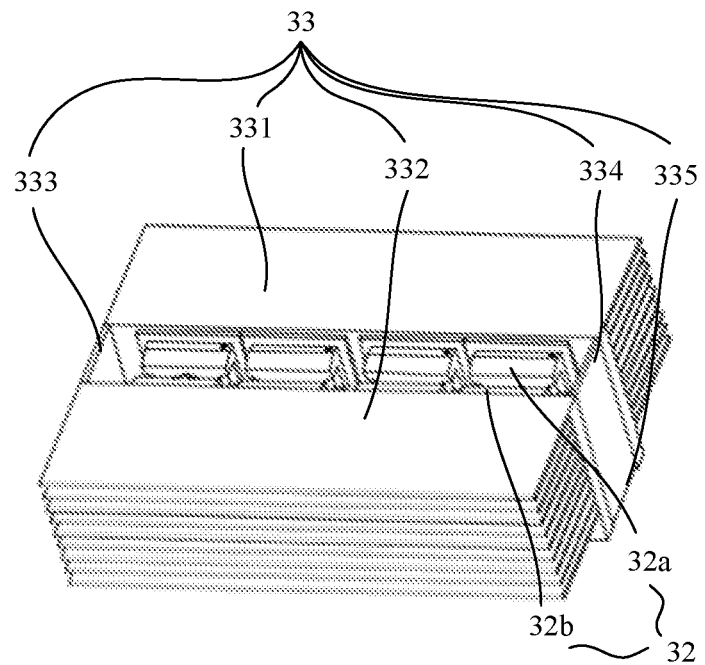
FIG. 17 is a schematic diagram of a structure of a sixth type of electronic component with an enclosure frame according to an embodiment of this application.

In some other embodiments, as shown in FIG. 17, there are a plurality of electronic components 32, and the plurality of electronic components 32 include at least one first electronic component 32a and at least one second electronic component 32b; and a plurality of side walls of an enclosure frame 33 include a first side wall 331 and a second side wall 332 opposite to each other, an electronic component body of the at least one first electronic component 32a is fastened to the first side wall 331, and an electronic component body of the at least one second electronic component 32b is fastened to the second side wall 332. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

Figure 18:
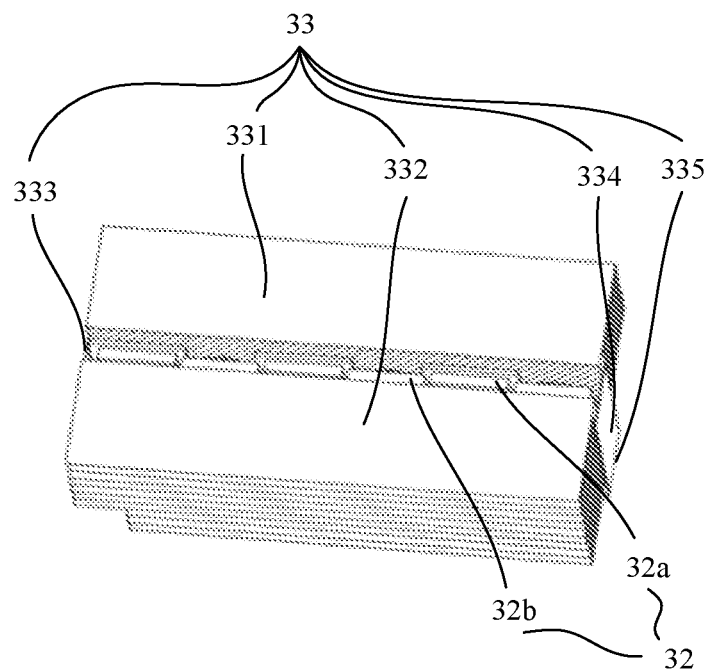
FIG. 18 is a schematic diagram of a structure of a seventh type of electronic component with an enclosure frame according to an embodiment of this application.

In the foregoing embodiments, the at least one first electronic component 32a and the at least one second electronic component 32b may be disposed opposite to each other, or may be disposed in a staggered manner. This is not specifically limited herein. In some embodiments, as shown in FIG. 17, the at least one first electronic component 32a and the at least one second electronic component 32b are disposed opposite to each other. In some other embodiments, as shown in FIG. 18, the at least one first electronic component 32a and the at least one second electronic component 32b are disposed in a staggered manner. In this way, each first electronic component 32a is not opposite to any second electronic component 32b, and a width of the enclosure frame 33 in a direction perpendicular to the first side wall 331 or the second side wall 332 can be reduced to further reduce an area occupied by the enclosure frame 33 on the circuit board 31.

Only the first end of the electronic component body 321 may be located inside the enclosure frame 33, or the entire electronic component body 321 may be located inside the enclosure frame 33. This is not specifically limited herein. However, in some electronic components 32, electronic component bodies 321 have exposed metal conductive parts. To prevent these metal conductive parts from being corroded, in some embodiments, as shown in FIG. 14 and FIG. 15, the entire electronic component body 321 is located inside the enclosure frame 33. In this way, before the electronic component 32 with an enclosure frame 33 is mounted on the circuit board 31, a sealant is filled in the cavity 34 defined by the enclosure frame 33, so that the sealant can cover the entire electronic component body 321. This prevents a metal conductive part of the electronic component body 321 from being corroded.

Figure 19:
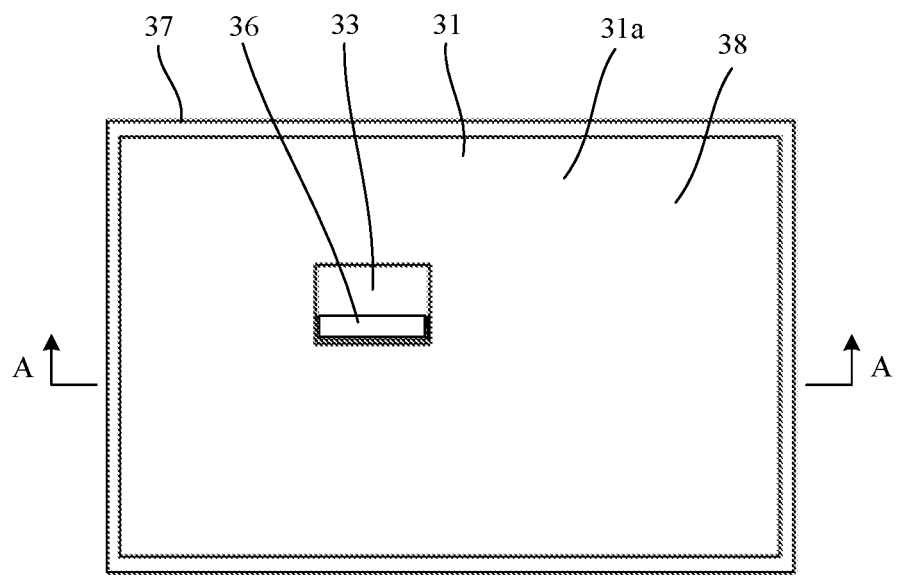
FIG. 19 is a top view of a sixth type of circuit board with an electronic component according to an embodiment of this application.
Figure 20:
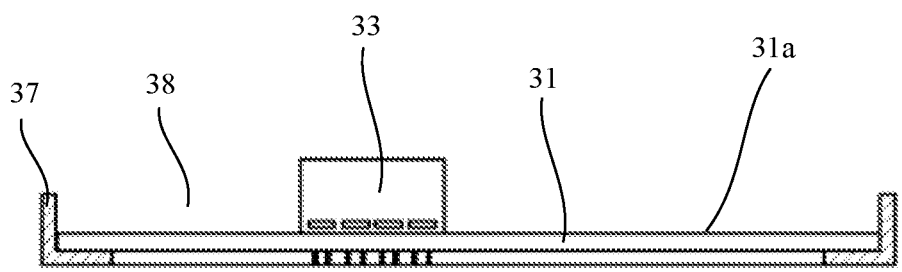
FIG. 20 is a cross-sectional view of the sixth type of circuit board with an electronic component shown in FIG. 19 along a cross section A-A.
Figure 21:
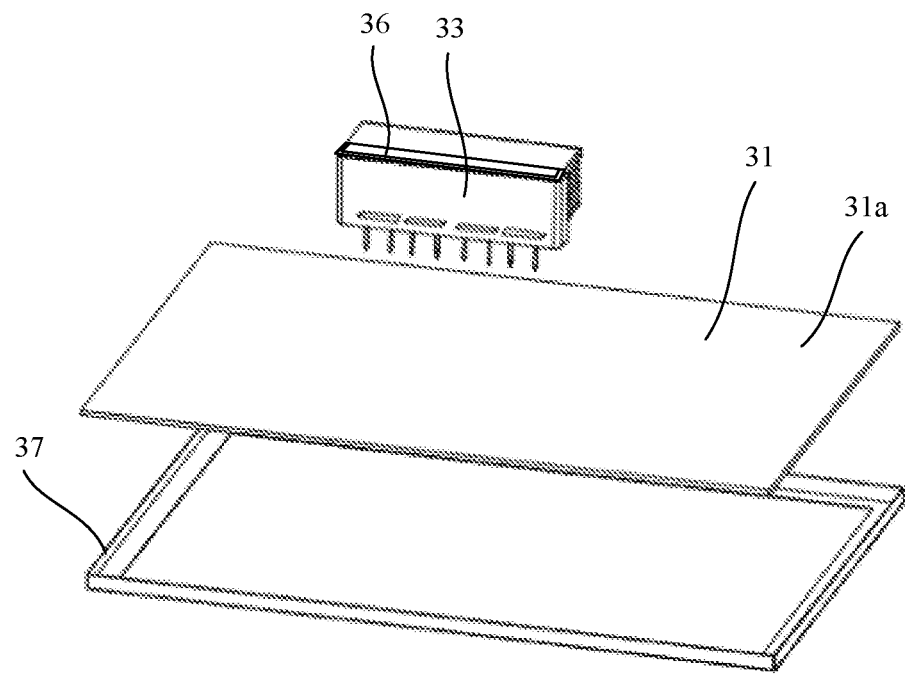
FIG. 21 is an exploded view of the sixth type of circuit board with an electronic component shown in FIG. 19.

In addition to the electronic component 32 with an enclosure frame 33, another electronic component is disposed on the first surface 31a of the circuit board 31. The another electronic component is connected to the first surface 31a of the circuit board 31 through mounting. To protect the electronic component from being corroded, in some embodiments, as shown in FIG. 19, FIG. 20, and FIG. 21, a first fence 37 is disposed around an edge of at least a partial region of the first surface 31a of the circuit board 31, the first fence 37 and the first surface 31a of the circuit board 31 define a groove 38, and the groove 38 is filled with a sealant. In this way, the another electronic component on the first surface 31a of the circuit board 31 can be covered by the sealant in the groove 38 to protect the electronic component from being corroded.

The first fence 37 may be disposed around an edge of the entire first surface 31a of the circuit board 31, or may be disposed around an edge of a partial region of the first surface 31a of the circuit board 31. This is not specifically limited herein. In some embodiments, as shown in FIG. 19, FIG. 20, and FIG. 21, the first fence 37 is disposed around the edge of the entire first surface 31a of the circuit board 31. In this way, all electronic components on the first surface 31a of the circuit board 31 can be protected from being corroded.

The first fence 37 may be a separately arranged insulating film or a separately arranged plastic part of an open mold, or may be a structure formed by folding an insulating film attached to the housing 1. This is not specifically limited herein.

Figure 22:
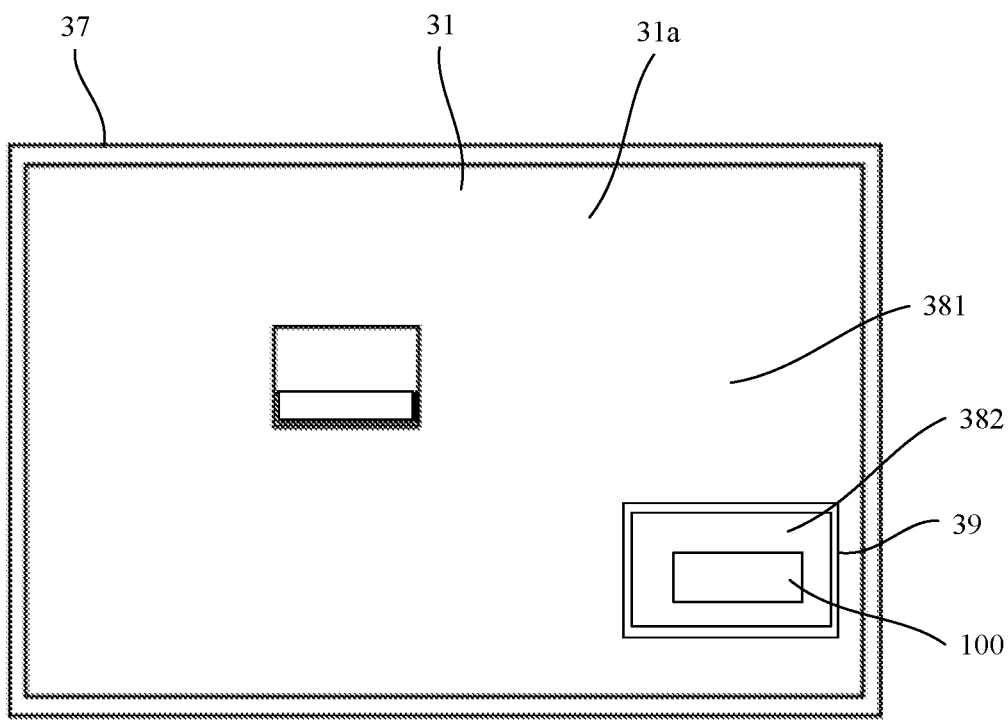
FIG. 22 is a schematic diagram of a structure of a seventh type of circuit board with an electronic component according to an embodiment of this application.

There are plug-in connectors on some circuit boards, and these plug-in connectors are used for external connection of plug-ins. To prevent the sealant from overflowing into a jack of a plug-in connector during filling of the sealant in the groove 38, in some embodiments, as shown in FIG. 22, a plug-in connector 100 is disposed on the first surface 31a of the circuit board 31, and the plug-in connector 100 is located inside the first fence 37. A second fence 39 is disposed on the first surface 31a of the circuit board 31 and around the plug-in connector 100, the second fence 39 is located inside the first fence 37, the first fence 37, the second fence 39, and the first surface 31a of the circuit board 31 define a first groove 381, the first groove 381 is filled with the sealant, the second fence 39 and the first surface 31a of the circuit board 31 define a second groove 382, and the second groove 382 is not filled with the sealant. In this way, due to blocking by the second fence 39, the sealant is prevented from overflowing into a jack of the plug-in connector 100 during filling of the sealant in the groove 38. After a plug-in is connected to the plug-in connector 100, the sealant can be filled in the second groove 382 to seal a connection gap between the plug-in and the plug-in connector 100, to protect a metal conductive part in the connection gap between the plug-in and the plug-in connector 100 from being corroded.

Figure 24:
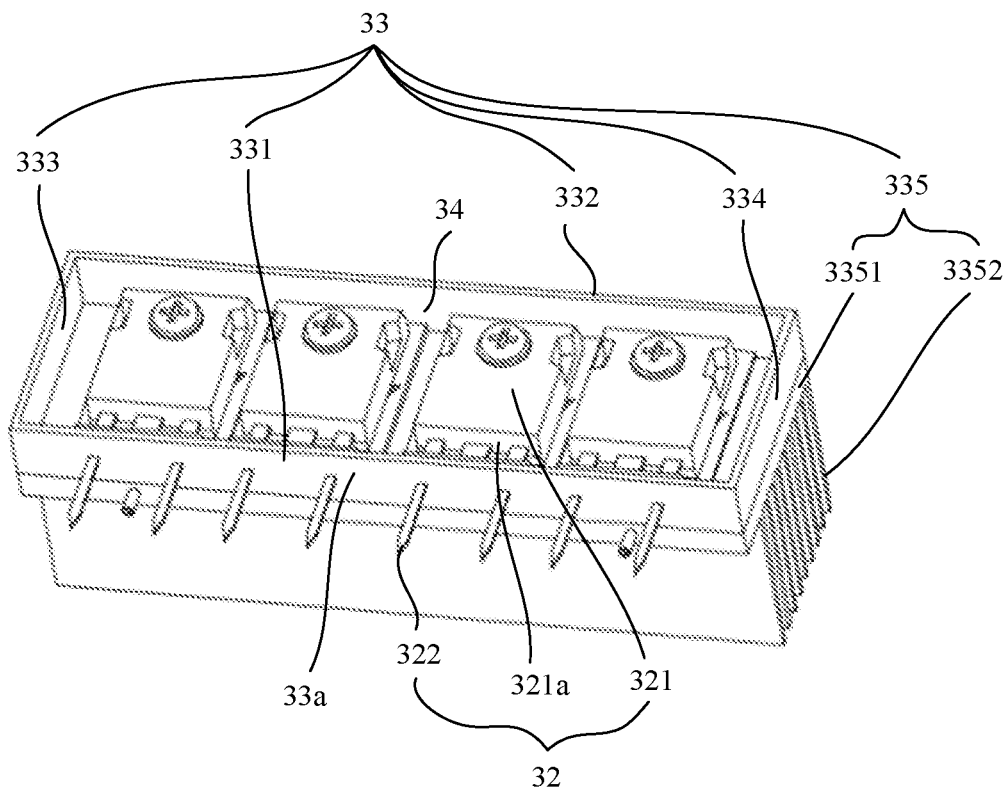
FIG. 24 is a schematic diagram of a structure of an eighth type of electronic component with an enclosure frame according to an embodiment of this application.

In a third optional implementation, as shown in FIG. 24, an electronic component 32 with an enclosure frame 33 includes an enclosure frame 33 and an electronic component 32. The enclosure frame 33 includes a bottom wall 335 and a plurality of side walls (for example, the plurality of side walls include a first side wall 331, a second side wall 332, a third side wall 333, and a fourth side wall 334) fastened to the bottom wall 335 and disposed around an edge of the bottom wall 335, the plurality of side walls include the first side wall 331, and an end at which an outer surface of the first side wall 331 is located is a first end 33a of the enclosure frame 33. The electronic component 32 includes an electronic component body 321 and a pin 322. The entire electronic component body 321 is located inside the enclosure frame 33, the electronic component body 321 is fastened to the bottom wall 335, and an end face of the first end 321a of the electronic component body 321 faces towards the first side wall 331. The pin 322 extends out of the electronic component body 321 from the end face of the first end 321a of the electronic component body 321, and extends out of the enclosure frame 33 after penetrating the first side wall 331.

Figure 23:
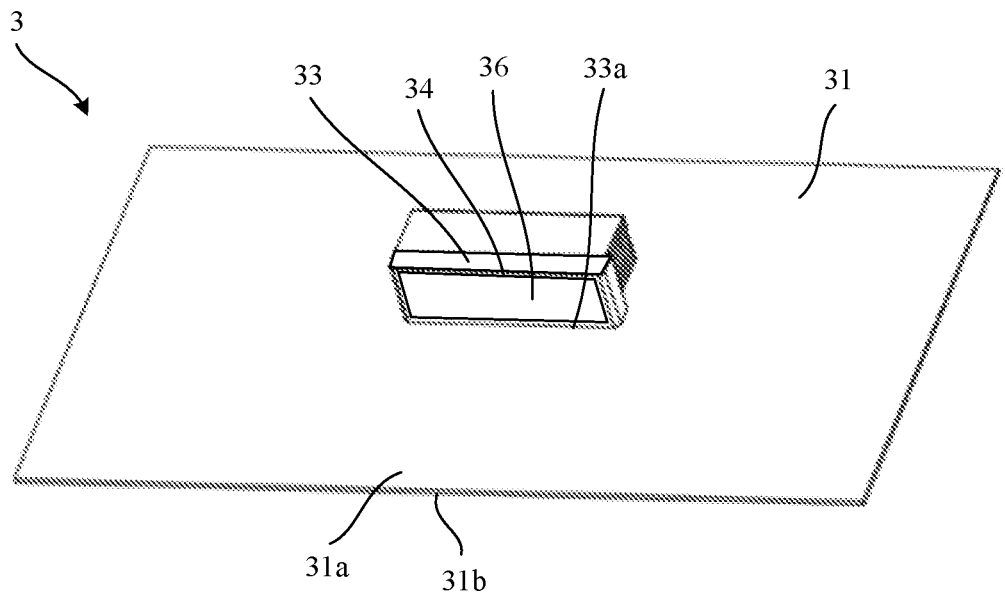
FIG. 23 is a schematic diagram of a structure of an eighth type of circuit board with an electronic component according to an embodiment of this application.
Figure 25:
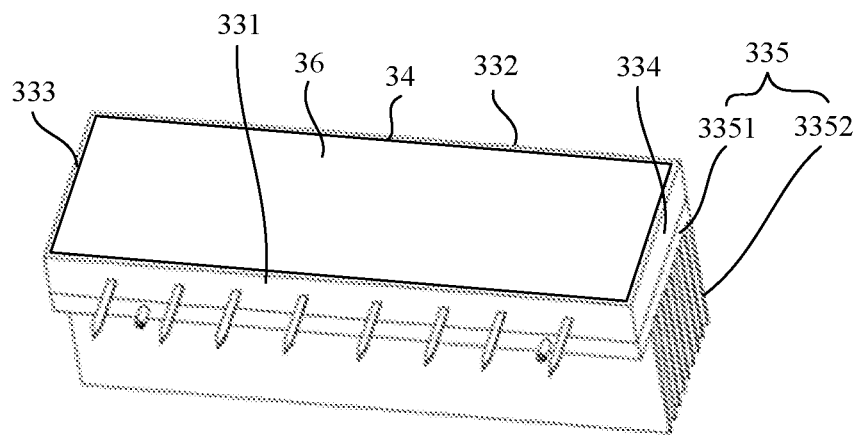
FIG. 25 is a schematic diagram of a structure of a ninth type of electronic component with an enclosure frame according to an embodiment of this application.

In this way, as shown in FIG. 24, the enclosure frame 33 defines a cavity 34 with one open end. Therefore, before the electronic component 32 with an enclosure frame 33 is connected to a circuit board 31, a sealant may be filled in the cavity 34 from an opening of the cavity 34. FIG. 25 is a schematic diagram of a structure of an electronic component 32 provided with an enclosure frame 33 and filled with a sealant. As shown in FIG. 25, a cavity 34 is filled with the sealant 36, and the sealant 36 covers an electronic component body 321 and a part that is of a pin 322 and that is located between an end face of a first end 321a of the electronic component body 321 and a first side wall 331. After the sealant 36 is cured, the electronic component 32 with an enclosure frame 33 is connected to the circuit board 31. In addition, in a process of connecting the electronic component 32 with an enclosure frame 33 to the circuit board 31, as shown in FIG. 23, an end face of the first end 33a of the enclosure frame 33 is attached and fastened to a first surface 31a of the circuit board 31. Therefore, there is no gap between the end face of the first end 33a of the enclosure frame 33 and the first surface 31a of the circuit board 31, and the pin 322 is not exposed. This can effectively protect a circuit board 3 with an electronic component from being corroded.

Figure 26:
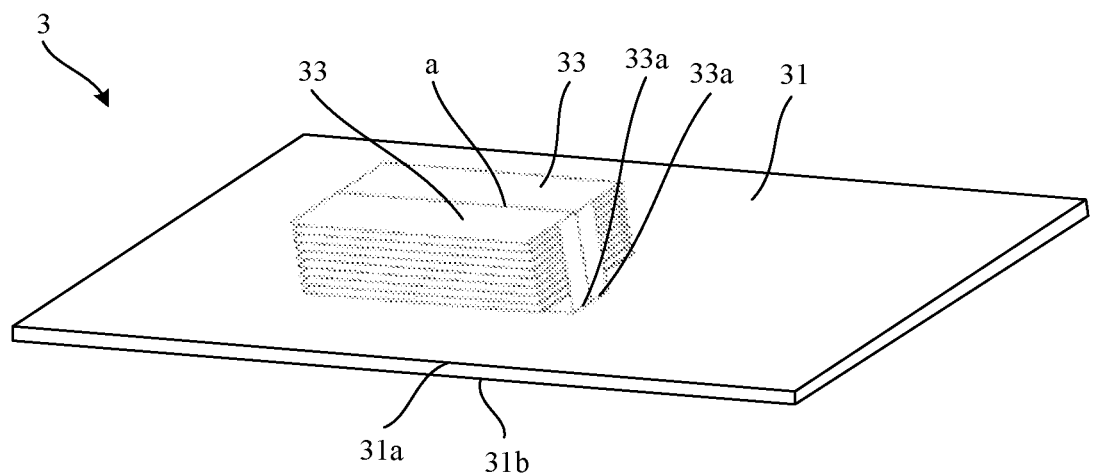
FIG. 26 is a schematic diagram of a structure of a ninth type of circuit board with an electronic component according to an embodiment of this application.

In some other embodiments, as shown in FIG. 26, there are an even number of electronic components 32 each with an enclosure frame 33 on the circuit board 31, and every two of the even number of electronic components 32 each with an enclosure frame 33 form a pair of electronic components 32. When the electronic component 32 with an enclosure frame 33 is connected to the circuit board 31, end faces a of ends of a plurality of side walls of one electronic component 32 of each pair of electronic components 32 each with an enclosure frame 33 may be disposed opposite to those of the other electronic component 32 thereof in an attachment manner, where all the ends are away from the bottom wall 335. In this way, end faces a of ends of a plurality of side walls of one electronic component 32 of each pair of electronic components 32 each with an enclosure frame 33 are disposed opposite to those of the other electronic component 32 thereof in an attachment manner, to form a sealed housing, where all the ends are away from the bottom wall. The electronic component body 321 and the part that is of the pin 322 and that is located between the end face of the first end 321a of the electronic component body 321 and the first side wall 331 are sealed in the sealed housing. In addition, the first end 33a of the enclosure frame 33 is attached to the first surface 31a of the circuit board 31 to implement sealing. This can effectively protect the pin 322 and the electronic component body 321 from being corroded.

In the foregoing embodiments, to further optimize the structure, tooth-shaped blades engaged with each other may be disposed between end faces a of ends of a plurality of side walls that are of each pair of electronic components 32 each with an enclosure frame 33 and that are away from the bottom wall 335, to increase a gap length and reduce a possibility that contaminants such as water and dust in an air duct enter the enclosure frame 33. Alternatively, a sealing material such as silicone grease, white adhesive, or an adhesive strip may be filled in a gap between end faces a of ends of a plurality of side walls that are of each pair of electronic components 32 each with an enclosure frame 33 and that are away from the bottom wall 335.

To improve a heat dissipation effect of the electronic component 32, in some embodiments, as shown in FIG. 24, the bottom wall 335 of the enclosure frame 33 includes a heat sink, and the electronic component body 321 is fastened to the heat sink. In this way, heat generated by the electronic component body 321 can be conducted to the outside of the enclosure frame 33 through the heat sink, and can be further carried away by cold air in an air duct 4.

The heat sink includes, but is not limited to, a refrigerant-cooled heat sink and a fin heat sink. In some embodiments, as shown in FIG. 24, the heat sink includes one first heat dissipation plate 3351 and a plurality of second heat dissipation plates 3352. The first heat dissipation plate 3351 has a first surface and a second surface that deviate from each other, and the electronic component body 321 is fastened to the first surface of the first heat dissipation plate 3351. The plurality of second heat dissipation plates 3352 are thermally connected to the second surface of the first heat dissipation plate 3351, and the plurality of second heat dissipation plates 3352 are stacked and are disposed at intervals. In this way, the heat generated by the electronic component body 321 is conducted from the first heat dissipation plate 3351 to the plurality of second heat dissipation plates 3352, and is further carried away by the cold air in the air duct 4. To enable the cold air in the air duct 4 to effectively blow away heat of the first heat dissipation plate 3351 and the second heat dissipation plates 3352, in some embodiments, the first heat dissipation plate 3351 and the second heat dissipation plates 3352 should be parallel to a flow direction of the cold air in the air duct 4. In this way, the cold air in the air duct 4 can pass through surfaces of the first heat dissipation plate 3351 and each second heat dissipation plate 3352 to carry away the heat of the surfaces of the first heat dissipation plate 3351 and the second heat dissipation plates 3352 as much as possible.

It should be noted that the plurality of second heat dissipation plates 3352 are thermally connected to the second surface of the first heat dissipation plate 3351, in other words, the plurality of second heat dissipation plates 3352 are connected to the second surface of the first heat dissipation plate 3351, and heat conduction can be performed between the plurality of second heat dissipation plates 3352 and the first heat dissipation plate 3351. The second heat dissipation plates 3352 may be thermally connected to the first heat dissipation plate 3351 in a manner such as thermally conductive adhesive-based bonding or integrated molding. In some embodiments, as shown in FIG. 24, the plurality of second heat dissipation plates 3352 and the first heat dissipation plate 3351 are integrally molded. In this way, the heat sink includes relatively few components, and has a simple composition structure.

The plurality of second heat dissipation plates 3352 may be perpendicular to the first heat dissipation plate 3351, or may not be perpendicular to the first heat dissipation plate 3351. This is not specifically limited herein. In some embodiments, as shown in FIG. 24, the plurality of second heat dissipation plates 3352 are perpendicular to the first heat dissipation plate 3351, facilitating positioning between the first heat dissipation plate 3351 and the plurality of second heat dissipation plates 3352.

Materials of the first heat dissipation plate 3351 and the plurality of second heat dissipation plates 3352 include, but are not limited to, aluminum and copper. When surfaces of the electronic component body 321 and the first heat dissipation plate 3351 are not plastic-packaged surfaces, an insulating thermally conductive film or a ceramic substrate needs to be mounted between the electronic component body 321 and the first heat dissipation plate 3351.

In some embodiments, as shown in FIG. 24, there are a plurality of electronic components 32, electronic component bodies 321 of the plurality of electronic components 32 are fastened to the bottom wall 335, and the plurality of electronic components 32 are arranged in a row in a direction parallel to the first side wall 331. In this way, pins 322 of the plurality of electronic components 32 can be protected from being corroded by using one enclosure frame 33, and an area occupied by the enclosure frame 33 on the circuit board 31 is relatively small. This is conducive to small-size design of the circuit board 3.

Figure 27:
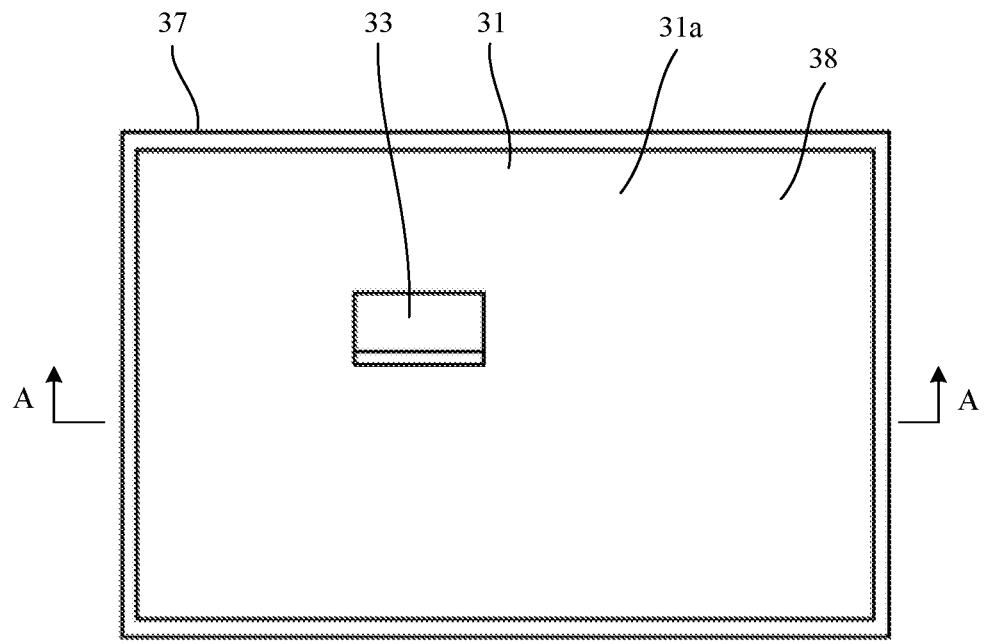
FIG. 27 is a top view of a tenth type of circuit board with an electronic component according to an embodiment of this application.
Figure 28:
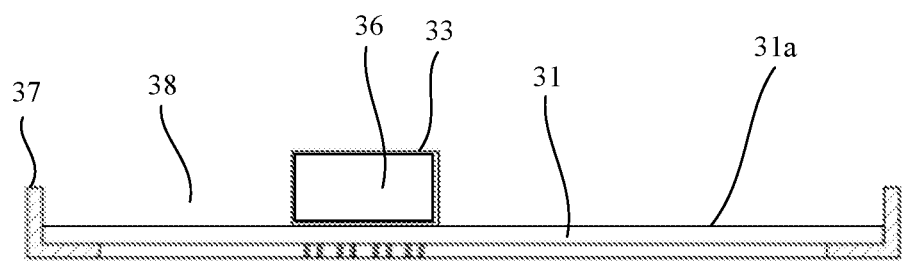
FIG. 28 is a cross-sectional view of the tenth type of circuit board with an electronic component shown in FIG. 27 along a cross section A-A.
Figure 29:
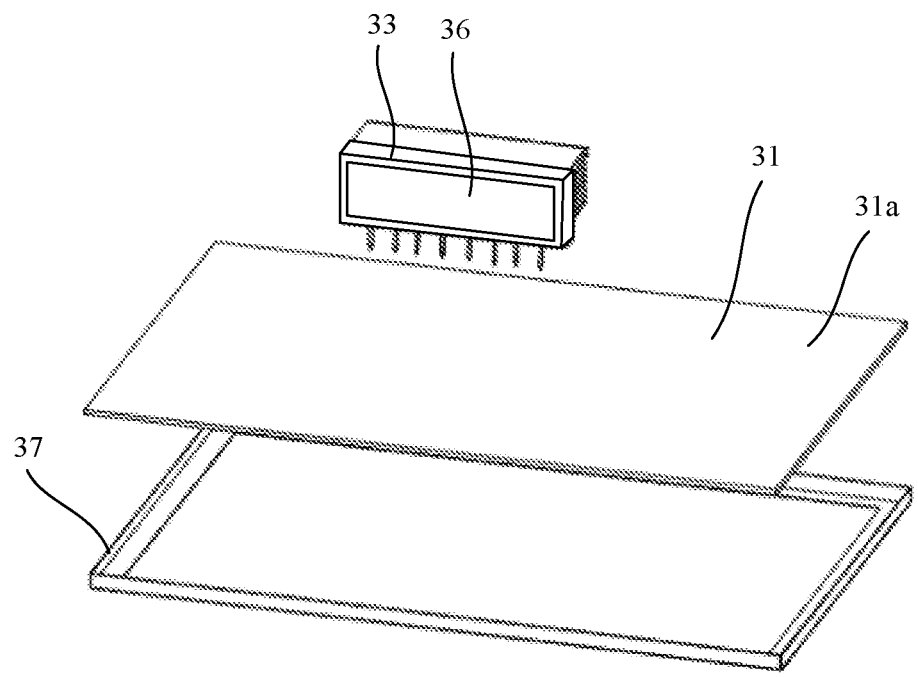
FIG. 29 is an exploded view of the tenth type of circuit board with an electronic component shown in FIG. 27.

In addition to the electronic component 32 with an enclosure frame 33, another electronic component is disposed on the first surface 31a of the circuit board 31. The another electronic component is connected to the first surface 31a of the circuit board 31 through mounting. To protect the electronic component from being corroded, in some embodiments, as shown in FIG. 27, FIG. 28, and FIG. 29, a first fence 37 is disposed around an edge of at least a partial region of the first surface 31a of the circuit board 31, the first fence 37 and the first surface 31a of the circuit board 31 define a groove 38, and the groove 38 is filled with a sealant. In this way, the another electronic component on the first surface 31a of the circuit board 31 can be covered by the sealant in the groove 38 to protect the electronic component from being corroded.

The first fence 37 may be disposed around an edge of the entire first surface 31a of the circuit board 31, or may be disposed around an edge of a partial region of the first surface 31a of the circuit board 31. This is not specifically limited herein. In some embodiments, as shown in FIG. 27, FIG. 28, and FIG. 29, the first fence 37 is disposed around the edge of the entire first surface 31a of the circuit board 31. In this way, all electronic components on the first surface 31a of the circuit board 31 can be protected from being corroded.

The first fence 37 may be a separately arranged insulating film or a separately arranged plastic part of an open mold, or may be a structure formed by folding an insulating film attached to the housing 1. This is not specifically limited herein.

Figure 30:
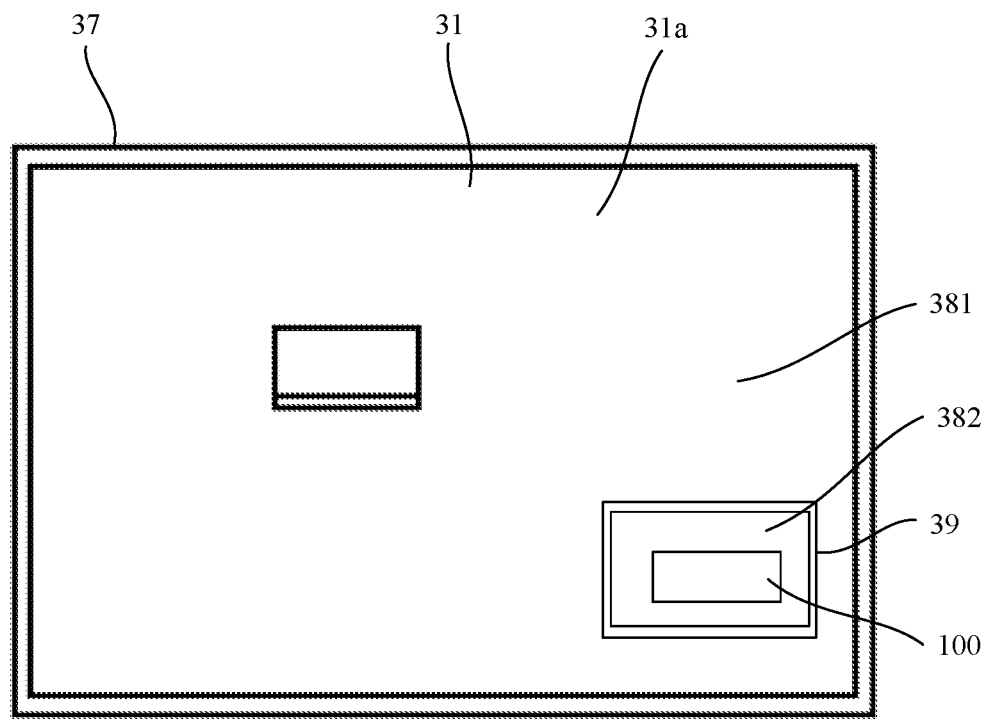
FIG. 30 is a top view of an eleventh type of circuit board with an electronic component according to an embodiment of this application.

There are plug-in connectors on some circuit boards, and these plug-in connectors are used for external connection of plug-ins. To prevent the sealant from overflowing into a jack of a plug-in connector during filling of the sealant in the groove 38, in some embodiments, as shown in FIG. 30, a plug-in connector 100 is disposed on the first surface 31a of the circuit board 31, and the plug-in connector 100 is located inside the first fence 37. A second fence 39 is disposed on the first surface 31a of the circuit board 31 and around the plug-in connector 100, the second fence 39 is located inside the first fence 37, the first fence 37, the second fence 39, and the first surface 31a of the circuit board 31 define a first groove 381, the first groove 381 is filled with the sealant, the second fence 39 and the first surface 31a of the circuit board 31 define a second groove 382, and the second groove 382 is not filled with the sealant. In this way, due to blocking by the second fence 39, the sealant is prevented from overflowing into a jack of the plug-in connector 100 during filling of the sealant in the groove 38. After a plug-in is connected to the plug-in connector 100, the sealant can be filled in the second groove 382 to seal a connection gap between the plug-in and the plug-in connector 100, to protect a metal conductive part in the connection gap between the plug-in and the plug-in connector 100 from being corroded.

Figure 31:
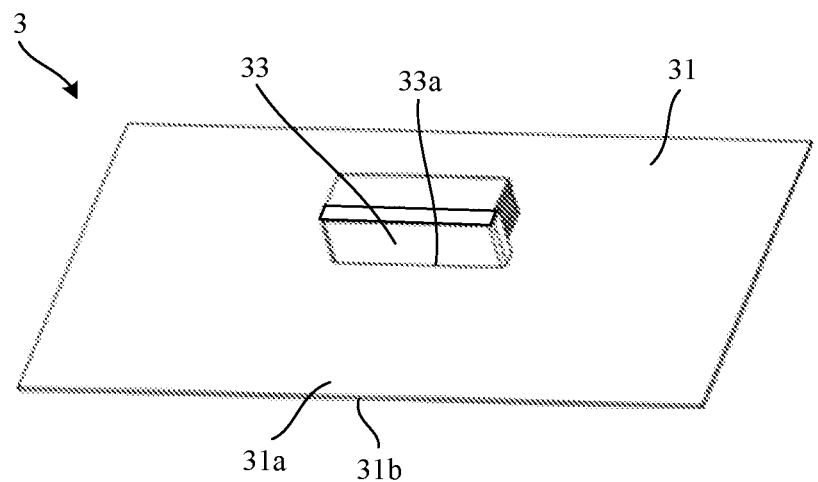
FIG. 31 is a schematic diagram of a structure of a twelfth type of circuit board with an electronic component according to an embodiment of this application.
Figure 32:
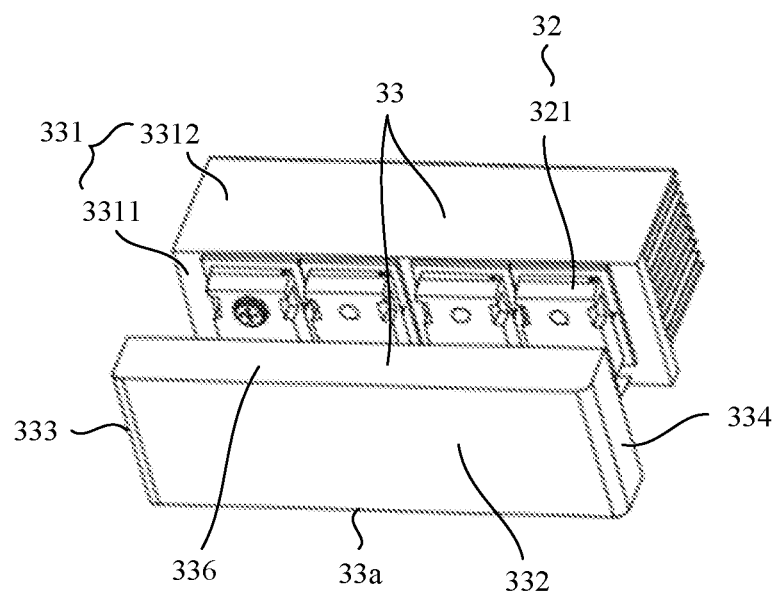
FIG. 32 is a schematic diagram of a structure of a tenth type of electronic component with an enclosure frame according to an embodiment of this application.
Figure 33:
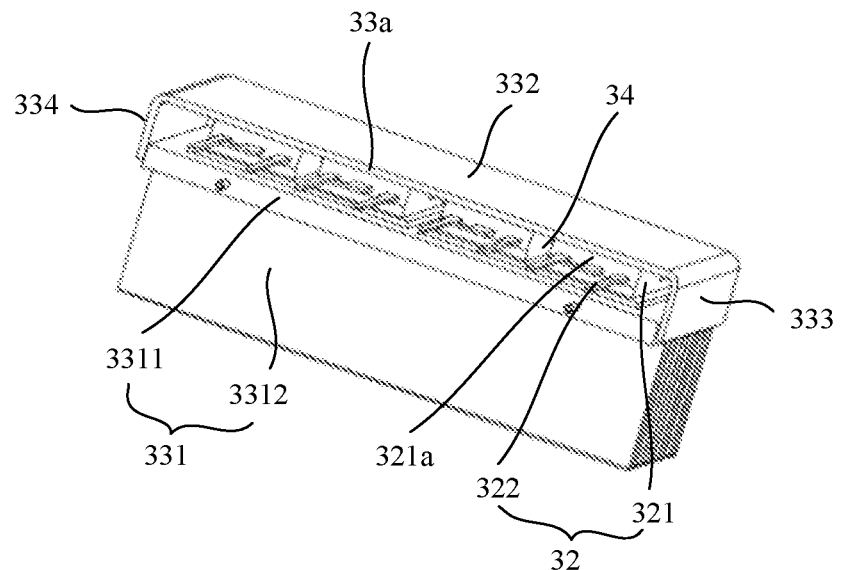
FIG. 33 is a schematic diagram of a structure of the tenth type of electronic component with an enclosure frame according to an embodiment of this application.

In a fourth optional implementation, as shown in FIG. 32, an electronic component 32 with an enclosure frame 33 includes an enclosure frame 33 and an electronic component 32. The enclosure frame 33 includes a top wall 336 and a plurality of side walls (for example, the plurality of side walls include a first side wall 331, a second side wall 332, a third side wall 333, and a fourth side wall 334) fastened to the top wall 336 and disposed around an edge of the top wall 336. As shown in FIG. 33, ends that are of the plurality of side walls and that are away from the top wall 336 define a first opening, and the ends that are of the plurality of side walls and that are away from the top wall 336 are a first end 33a of the enclosure frame 33. As shown in FIG. 33, the electronic component 32 includes an electronic component body 321 and a pin 322. The entire electronic component body 321 is located inside the enclosure frame 33, the electronic component body 321 is fastened to a side wall (for example, the first side wall 331) of the enclosure frame 33, and an end face of a first end 321a of the electronic component body 321 faces towards the first opening. The pin 322 extends out of the electronic component body 321 from the end face of the first end 321a of the electronic component body 321, and extends out of the enclosure frame 33 from the first opening. In this way, when the electronic component 32 with an enclosure frame 33 is mounted on a circuit board 31, as shown in FIG. 31, the enclosure frame 33 and the circuit board 31 define a closed cavity, and the electronic component body 321 and a part that is of the pin 322 and that is located between the end face of the first end 321a of the electronic component body 321 and a first surface 31a of the circuit board 31 are sealed in the closed cavity. This can effectively protect the pin 322 and the electronic component body 321 from being corroded.

Figure 34:
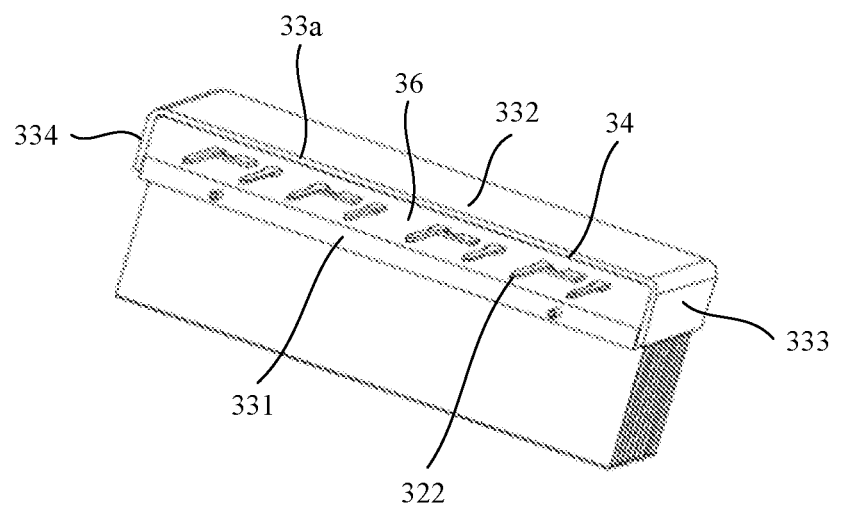
FIG. 34 is a schematic diagram of a structure of an eleventh type of electronic component with an enclosure frame according to an embodiment of this application.

As shown in FIG. 33, before the electronic component 32 with an enclosure frame 33 is connected to the circuit board 31, the enclosure frame 33 defines a cavity 34 with one open end. Therefore, a sealant may be filled in the cavity 34 from an opening of the cavity 34. FIG. 34 is a schematic diagram of a structure of an electronic component 32 provided with an enclosure frame 33 and filled with a sealant. As shown in FIG. 34, a cavity 34 is filled with the sealant 36, and the sealant 36 covers an electronic component body 321 and a part that is of a pin 322 and that is located between an end face of a first end 321a of the electronic component body 321 and a first opening, in other words, the cavity 34 is fully filled with the sealant. In this way, the electronic component body 321 and the part that is of the pin 322 and that is located between the end face of the first end 321a of the electronic component body 321 and the first opening are covered by the sealant 36; and after the sealant 36 is cured, the electronic component 32 with an enclosure frame 33 is connected to the circuit board 31, so that the sealant 36 is attached to the first surface 31a of the circuit board 31 to implement more effective sealing. This further effectively protects the pin 322 from being corroded.

To improve a heat dissipation effect of the electronic component 32, in some embodiments, as shown in FIG. 32, a wall (for example, the first side wall 331) of the enclosure frame 33 to which the electronic component body 321 is fastened includes a heat sink. In this way, heat generated by the electronic component body 321 can be conducted to the outside of the enclosure frame 33 through the heat sink, and can be further carried away by cold air in an air duct 4.

The heat sink includes, but is not limited to, a refrigerant-cooled heat sink and a fin heat sink. In some embodiments, as shown in FIG. 32, the heat sink includes one first heat dissipation plate 3311 and a plurality of second heat dissipation plates 3312. The first heat dissipation plate 3311 has a first surface and a second surface that deviate from each other, and the electronic component body 321 is fastened to the first surface of the first heat dissipation plate 3311. The plurality of second heat dissipation plates 3312 are thermally connected to the second surface of the first heat dissipation plate 3311, and the plurality of second heat dissipation plates 3312 are stacked and are disposed at intervals. In this way, the heat generated by the electronic component body 321 is conducted from the first heat dissipation plate 3311 to the plurality of second heat dissipation plates 3312, and is further carried away by the cold air in the air duct 4. To enable the cold air in the air duct 4 to effectively blow away heat of the first heat dissipation plate 3311 and the second heat dissipation plates 3312, in some embodiments, the first heat dissipation plate 3311 and the second heat dissipation plates 3312 should be parallel to a flow direction of the cold air in the air duct 4. In this way, the cold air in the air duct 4 can pass through surfaces of the first heat dissipation plate 3311 and each second heat dissipation plate 3312 to carry away the heat of the surfaces of the first heat dissipation plate 3311 and the second heat dissipation plates 3312 as much as possible.

It should be noted that the plurality of second heat dissipation plates 3312 are thermally connected to the second surface of the first heat dissipation plate 3311, in other words, the plurality of second heat dissipation plates 3312 are connected to the second surface of the first heat dissipation plate 3311, and heat conduction can be performed between the plurality of second heat dissipation plates 3312 and the first heat dissipation plate 3311. The second heat dissipation plates 3312 may be thermally connected to the first heat dissipation plate 3311 in a manner such as thermally conductive adhesive-based bonding or integrated molding. In some embodiments, the plurality of second heat dissipation plates 3312 and the first heat dissipation plate 3311 are integrally molded. In this way, the heat sink includes relatively few components, and has a simple composition structure.

The plurality of second heat dissipation plates 3312 may be perpendicular to the first heat dissipation plate 3311, or may not be perpendicular to the first heat dissipation plate 3311. In some embodiments, as shown in FIG. 32 and FIG. 33, the plurality of second heat dissipation plates 3312 are perpendicular to the first heat dissipation plate 3311, facilitating positioning between the first heat dissipation plate 3311 and the plurality of second heat dissipation plates 3312.

Materials of the first heat dissipation plate 3311 and the plurality of second heat dissipation plates 3312 include, but are not limited to, aluminum and copper. When surfaces of the electronic component body 321 and the first heat dissipation plate 3311 are not plastic-packaged surfaces, an insulating thermally conductive film or a ceramic substrate needs to be mounted between the electronic component body 321 and the first heat dissipation plate 3311.

In some embodiments, as shown in FIG. 32 and FIG. 33, there are a plurality of electronic components 32, the plurality of side walls of the enclosure frame 33 include a first side wall 331, and electronic component bodies 321 of the plurality of electronic components 32 are fastened to the first side wall 331. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

In some other embodiments, there are a plurality of electronic components 32, and the plurality of electronic components 32 include at least one first electronic component (not shown in the figure) and at least one second electronic component (not shown in the figure); and a plurality of side walls of an enclosure frame 33 include a first side wall 331 and a second side wall 332 opposite to each other, an electronic component body of the at least one first electronic component is fastened to the first side wall 331, and an electronic component body of the at least one second electronic component is fastened to the second side wall 332. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

In the foregoing embodiments, the at least one first electronic component and the at least one second electronic component may be disposed opposite to each other, or may be disposed in a staggered manner. This is not specifically limited herein. In some embodiments, the at least one first electronic component and the at least one second electronic component are disposed opposite to each other. In some other embodiments, the at least one first electronic component and the at least one second electronic component are disposed in a staggered manner. In this way, each first electronic component is not opposite to any second electronic component, and a width of the enclosure frame 33 in a direction perpendicular to the first side wall 331 or the second side wall 332 can be reduced to further reduce an area occupied by the enclosure frame 33 on the circuit board 31.

Figure 35:
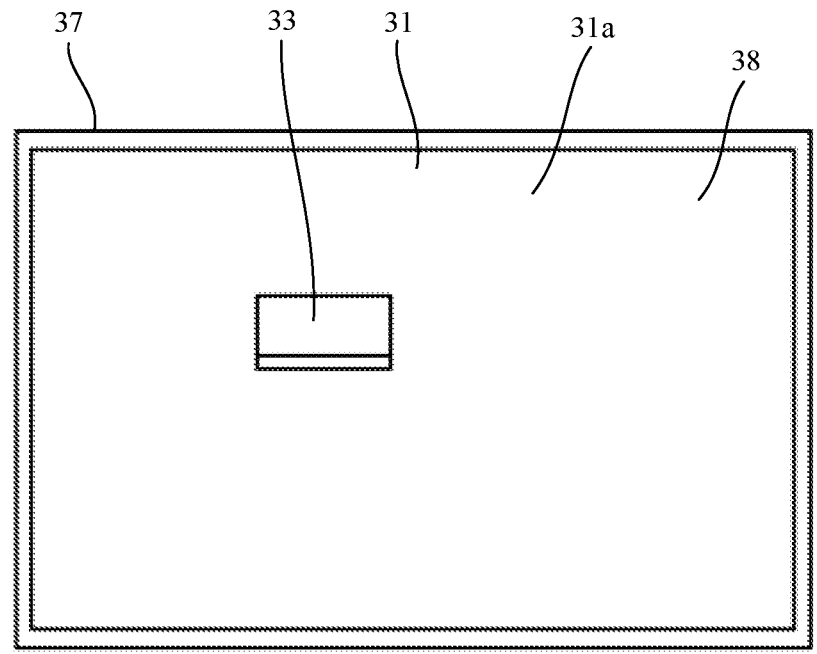
FIG. 35 is a top view of a thirteenth type of circuit board with an electronic component according to an embodiment of this application.

In addition to the electronic component 32 with an enclosure frame 33, another electronic component is disposed on the first surface 31a of the circuit board 31. The another electronic component is connected to the first surface 31a of the circuit board 31 through mounting. To protect the electronic component from being corroded, in some embodiments, as shown in FIG. 35, a first fence 37 is disposed around an edge of at least a partial region of the first surface 31a of the circuit board 31, the first fence 37 and the first surface 31a of the circuit board 31 define a groove 38, and the groove 38 is filled with a sealant. In this way, the another electronic component on the first surface 31a of the circuit board 31 can be covered by the sealant in the groove 38 to protect the electronic component from being corroded.

The first fence 37 may be disposed around an edge of the entire first surface 31a of the circuit board 31, or may be disposed around an edge of a partial region of the first surface 31a of the circuit board 31. This is not specifically limited herein. In some embodiments, as shown in FIG. 35, the first fence 37 is disposed around the edge of the entire first surface 31a of the circuit board 31. In this way, all electronic components on the first surface 31a of the circuit board 31 can be protected from being corroded.

The first fence 37 may be a separately arranged insulating film or a separately arranged plastic part of an open mold, or may be a structure formed by folding an insulating film attached to the housing 1. This is not specifically limited herein.

Figure 36:
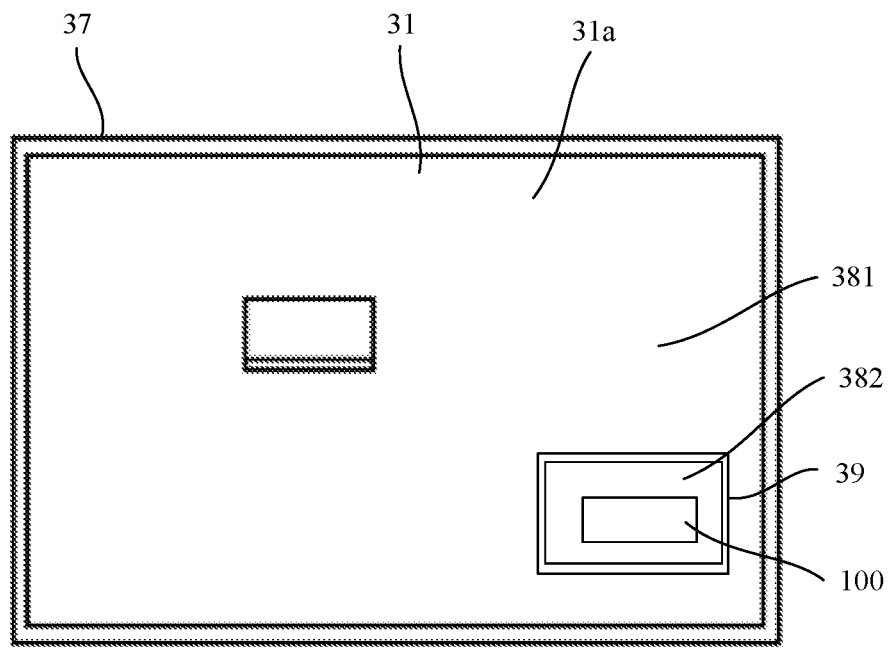
FIG. 36 is a top view of a fourteenth type of circuit board with an electronic component according to an embodiment of this application.

There are plug-in connectors on some circuit boards, and these plug-in connectors are used for external connection of plug-ins. To prevent the sealant from overflowing into a jack of a plug-in connector during filling of the sealant in the groove 38, in some embodiments, as shown in FIG. 36, a plug-in connector 100 is disposed on the first surface 31a of the circuit board 31, and the plug-in connector 100 is located inside the first fence 37. A second fence 39 is disposed on the first surface 31a of the circuit board 31 and around the plug-in connector 100, the second fence 39 is located inside the first fence 37, the first fence 37, the second fence 39, and the first surface 31a of the circuit board 31 define a first groove 381, the first groove 381 is filled with the sealant, the second fence 39 and the first surface 31a of the circuit board 31 define a second groove 382, and the second groove 382 is not filled with the sealant. In this way, due to blocking by the second fence 39, the sealant is prevented from overflowing into a jack of the plug-in connector 100 during filling of the sealant in the groove 38. After a plug-in is connected to the plug-in connector 100, the sealant can be filled in the second groove 382 to seal a connection gap between the plug-in and the plug-in connector 100, to protect a metal conductive part in the connection gap between the plug-in and the plug-in connector 100 from being corroded.

Figure 38:
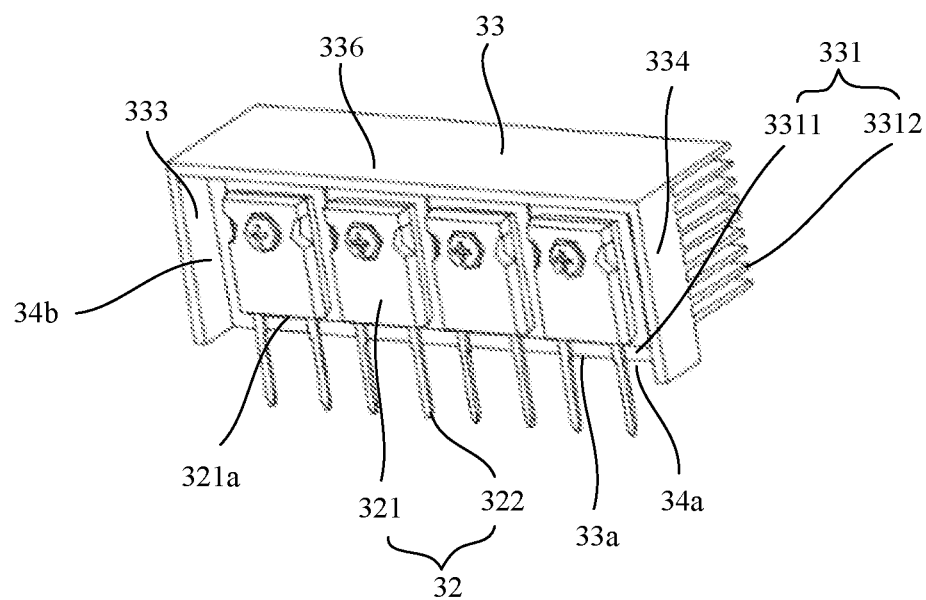
FIG. 38 is a schematic diagram of a structure of a twelfth type of electronic component with an enclosure frame according to an embodiment of this application.

In a fifth optional implementation, as shown in FIG. 38, an electronic component 32 with an enclosure frame 33 includes an enclosure frame 33 and an electronic component 32. The enclosure frame 33 includes a top wall 336 and a plurality of side walls (for example, the plurality of side walls include a first side wall 331, a third side wall 333, and a fourth side wall 334) fastened to the top wall 336 and disposed around an edge of the top wall 336. Ends that are of the plurality of side walls and that are away from the top wall 336 define a first opening 34a, one end of the enclosure frame 33 in a direction parallel to the top wall 336 defines a second opening 34b, and the ends that are of the plurality of side walls and that are away from the top wall 336 are a first end 33a of the enclosure frame 33. The electronic component 32 includes an electronic component body 321 and a pin 322. The entire electronic component body 321 is located inside the enclosure frame 33, the electronic component body 321 is fastened to a side wall (for example, the first side wall 331) of the enclosure frame 33, and an end face of a first end 321a of the electronic component body 321 faces towards the first opening 34a. The pin 322 extends out of the electronic component body 321 from the end face of the first end 321a of the electronic component body 321, and extends out of the enclosure frame 33 from the first opening 34a.

Figure 37:
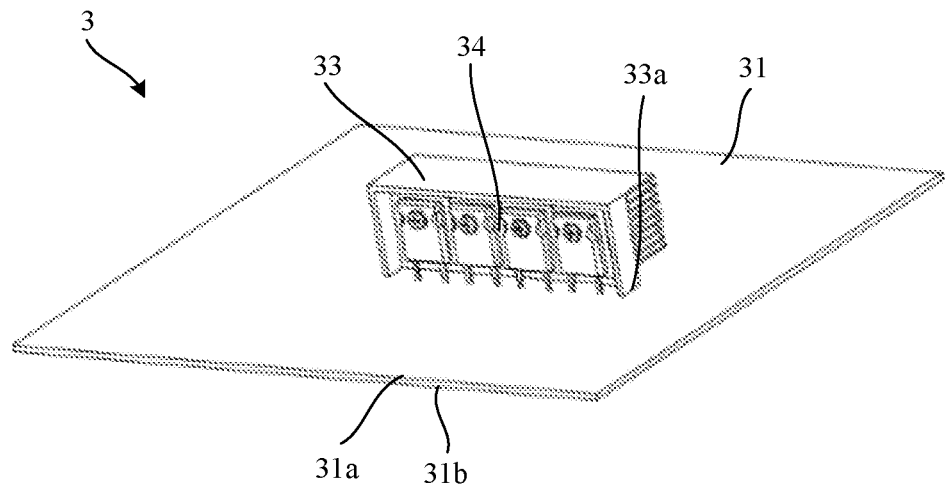
FIG. 37 is a schematic diagram of a structure of a fifteenth type of circuit board with an electronic component according to an embodiment of this application.
Figure 39:
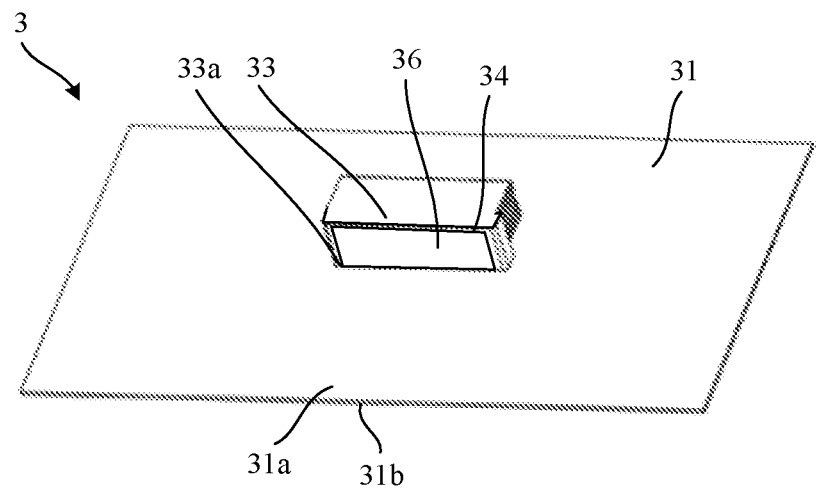
FIG. 39 is a schematic diagram of a structure of a sixteenth type of circuit board with an electronic component according to an embodiment of this application.

In this way, in some embodiments, after the electronic component 32 with an enclosure frame 33 is connected to a circuit board 31, as shown in FIG. 37, the enclosure frame 33 and the circuit board 31 define a cavity 34 with one open end, and a sealant is filled in the cavity 34 from an opening of the cavity 34. FIG. 39 is a schematic diagram of a cavity 34 is filled with a sealant 36. As shown in FIG. 39, the sealant 36 covers an electronic component body 321 and a part that is of a pin 322 and that is located between an end face of a first end 321a of the electronic component body 321 and a first surface 31a of a circuit board 31. In this way, the electronic component body 321 and the part that is of the pin 322 and that is located between the end face of the first end 321a of the electronic component body 321 and the first surface 31a of the circuit board 31 are covered by the sealant 36; and after the sealant 36 is cured, another electronic component is mounted on the circuit board 31. This can effectively protect the electronic component body 321 and the pin 322 from being corroded.

Figure 40:
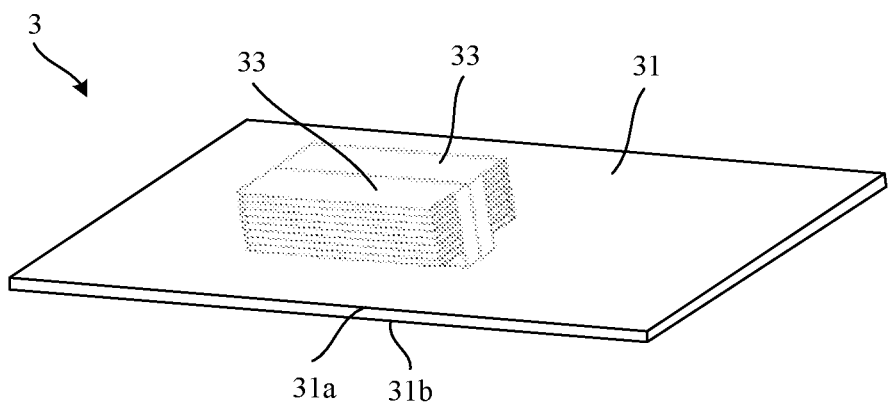
FIG. 40 is a schematic diagram of a structure of a seventeenth type of circuit board with an electronic component according to an embodiment of this application.

In some other embodiments, as shown in FIG. 40, there are an even number of electronic components 32 each with an enclosure frame 33 on the circuit board 31, every two of the even number of electronic components 32 each with an enclosure frame 33 form a pair of electronic components 32, and end faces of ends that are of enclosure frames 33 of each pair of electronic components 32 each with an enclosure frame 33 and at which second openings 34b are defined are disposed opposite to each other in an attachment manner. In this way, end faces of ends that are of enclosure frames 33 of each pair of electronic components 32 each with an enclosure frame 33 and at which second openings 34b are defined are disposed opposite to each other in an attachment manner, to form a sealed housing. The electronic component body 321 and the part that is of the pin 322 and that is located between the end face of the first end 321a of the electronic component body 321 and the first surface 31a of the circuit board 31 are sealed in the sealed housing. This can effectively protect the pin 322 and the electronic component body 321 from being corroded.

In the foregoing embodiments, to further optimize the structure, tooth-shaped blades engaged with each other may be disposed between end faces of ends that are of enclosure frames 33 of each pair of electronic components 32 each with an enclosure frame 33 and at which second openings 34b are defined, to increase a gap length and reduce a possibility that contaminants such as water and dust in an air duct enter the enclosure frame 33. Alternatively, a sealing material such as silicone grease, white adhesive, or an adhesive strip may be filled in a gap between end faces of ends that are of enclosure frames 33 of each pair of electronic components 32 each with an enclosure frame 33 and at which second openings 34b are defined.

To improve a heat dissipation effect of the electronic component 32, in some embodiments, as shown in FIG. 38, a wall (for example, the first side wall 331) of the enclosure frame 33 to which the electronic component body 321 is fastened includes a heat sink. In this way, heat generated by the electronic component body 321 can be conducted to the outside of the enclosure frame 33 through the heat sink, and can be further carried away by cold air in an air duct 4.

The heat sink includes, but is not limited to, a refrigerant-cooled heat sink and a fin heat sink. In some embodiments, as shown in FIG. 38, the heat sink includes one first heat dissipation plate 3311 and a plurality of second heat dissipation plates 3312. The first heat dissipation plate 3311 has a first surface and a second surface that deviate from each other, and the electronic component body 321 is fastened to the first surface of the first heat dissipation plate 3311. The plurality of second heat dissipation plates 3312 are thermally connected to the second surface of the first heat dissipation plate 3311, and the plurality of second heat dissipation plates 3312 are stacked and are disposed at intervals. In this way, the heat generated by the electronic component body 321 is conducted from the first heat dissipation plate 3311 to the plurality of second heat dissipation plates 3312, and is further carried away by the cold air in the air duct 4. To enable the cold air in the air duct 4 to effectively blow away heat of the first heat dissipation plate 3311 and the second heat dissipation plates 3312, in some embodiments, the first heat dissipation plate 3311 and the second heat dissipation plates 3312 should be parallel to a flow direction of the cold air in the air duct 4. In this way, the cold air in the air duct 4 can pass through surfaces of the first heat dissipation plate 3311 and each second heat dissipation plate 3312 to carry away the heat of the surfaces of the first heat dissipation plate 3311 and the second heat dissipation plates 3312 as much as possible.

It should be noted that the plurality of second heat dissipation plates 3312 are thermally connected to the second surface of the first heat dissipation plate 3311, in other words, the plurality of second heat dissipation plates 3312 are connected to the second surface of the first heat dissipation plate 3311, and heat conduction can be performed between the plurality of second heat dissipation plates 3312 and the first heat dissipation plate 3311. The second heat dissipation plates 3312 may be thermally connected to the first heat dissipation plate 3311 in a manner such as thermally conductive adhesive-based bonding or integrated molding. In some embodiments, as shown in FIG. 38, the plurality of second heat dissipation plates 3312 and the first heat dissipation plate 3311 are integrally molded. In this way, the heat sink includes relatively few components, and has a simple composition structure.

The plurality of second heat dissipation plates 3312 may be perpendicular to the first heat dissipation plate 3311, or may not be perpendicular to the first heat dissipation plate 3311. This is not specifically limited herein. In some embodiments, as shown in FIG. 38, the plurality of second heat dissipation plates 3312 are perpendicular to the first heat dissipation plate 3311, facilitating positioning between the first heat dissipation plate 3311 and the plurality of second heat dissipation plates 3312.

Materials of the first heat dissipation plate 3311 and the plurality of second heat dissipation plates 3312 include, but are not limited to, aluminum and copper. When surfaces of the electronic component body 321 and the first heat dissipation plate 3311 are not plastic-packaged surfaces, an insulating thermally conductive film or a ceramic substrate needs to be mounted between the electronic component body 321 and the first heat dissipation plate 3311.

In some embodiments, as shown in FIG. 38, there are a plurality of electronic components 32, the plurality of side walls of the enclosure frame 33 include a first side wall 331, the first side wall 331 includes a heat sink, and electronic component bodies 321 of the plurality of electronic components 32 are fastened to the first side wall 331. In this way, pins 322 of the plurality of electronic components 32 can be protected from being corroded by using one enclosure frame, and an area occupied by the enclosure frame 33 on a circuit board 31 is relatively small. This is conducive to small-size design of a circuit board 3.

Figure 41:
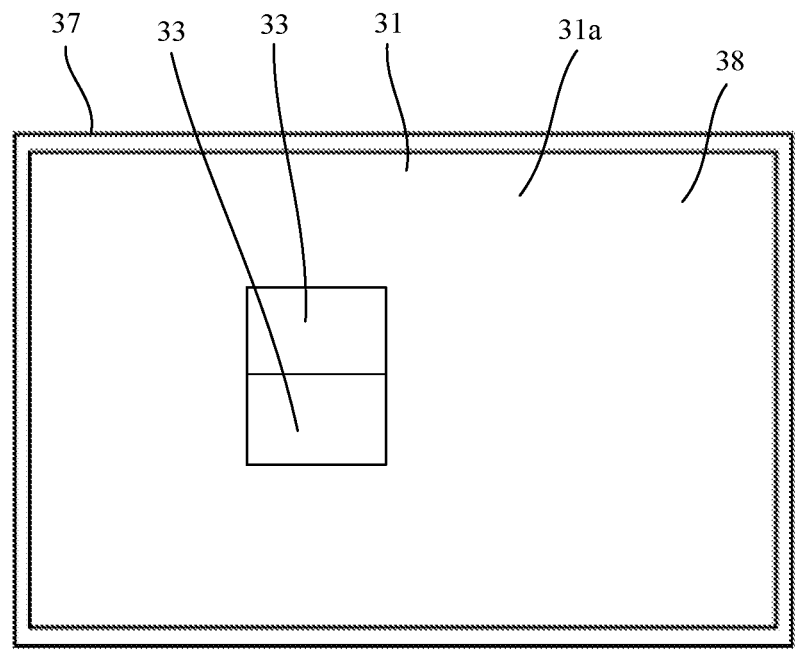
FIG. 41 is a top view of an eighteenth type of circuit board with an electronic component according to an embodiment of this application.

In addition to the electronic component 32 with an enclosure frame 33, another electronic component is disposed on the first surface 31a of the circuit board 31. The another electronic component is connected to the first surface 31a of the circuit board 31 through mounting. To protect the electronic component from being corroded, in some embodiments, as shown in FIG. 41, a first fence 37 is disposed around an edge of at least a partial region of the first surface 31a of the circuit board 31, the first fence 37 and the first surface 31a of the circuit board 31 define a groove 38, and the groove 38 is filled with a sealant. In this way, the another electronic component on the first surface 31a of the circuit board 31 can be covered by the sealant in the groove 38 to protect the electronic component from being corroded.

The first fence 37 may be disposed around an edge of the entire first surface 31a of the circuit board 31, or may be disposed around an edge of a partial region of the first surface 31a of the circuit board 31. This is not specifically limited herein. In some embodiments, as shown in FIG. 41, the first fence 37 is disposed around the edge of the entire first surface 31a of the circuit board 31. In this way, all electronic components on the first surface 31a of the circuit board 31 can be protected from being corroded.

The first fence 37 may be a separately arranged insulating film or a separately arranged plastic part of an open mold, or may be a structure formed by folding an insulating film attached to the housing 1. This is not specifically limited herein.

Figure 42:
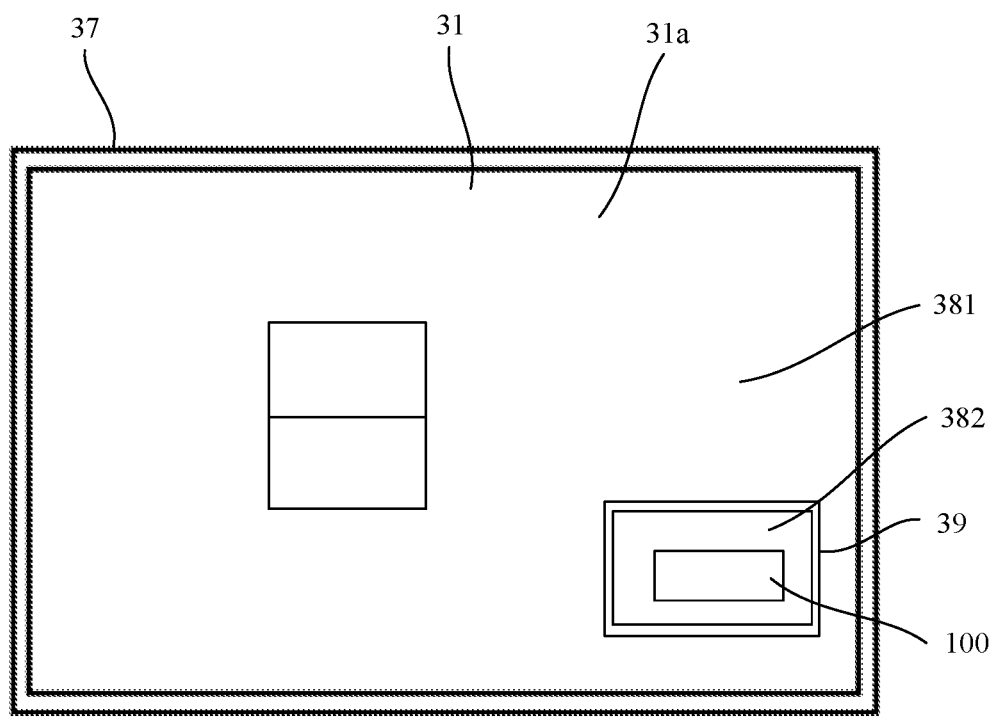
FIG. 42 is a top view of a nineteenth type of circuit board with an electronic component according to an embodiment of this application.

There are plug-in connectors on some circuit boards, and these plug-in connectors are used for external connection of plug-ins. To prevent the sealant from overflowing into a jack of a plug-in connector during filling of the sealant in the groove 38, in some embodiments, as shown in FIG. 42, a plug-in connector 100 is disposed on the first surface 31a of the circuit board 31, and the plug-in connector 100 is located inside the first fence 37. A second fence 39 is disposed on the first surface 31a of the circuit board 31 and around the plug-in connector 100, the second fence 39 is located inside the first fence 37, the first fence 37, the second fence 39, and the first surface 31a of the circuit board 31 define a first groove 381, the first groove 381 is filled with the sealant, the second fence 39 and the first surface 31a of the circuit board 31 define a second groove 382, and the second groove 382 is not filled with the sealant. In this way, due to blocking by the second fence 39, the sealant is prevented from overflowing into a jack of the plug-in connector 100 during filling of the sealant in the groove 38. After a plug-in is connected to the plug-in connector 100, the sealant can be filled in the second groove 382 to seal a connection gap between the plug-in and the plug-in connector 100, to protect a metal conductive part in the connection gap between the plug-in and the plug-in connector 100 from being corroded.

Figure 43:
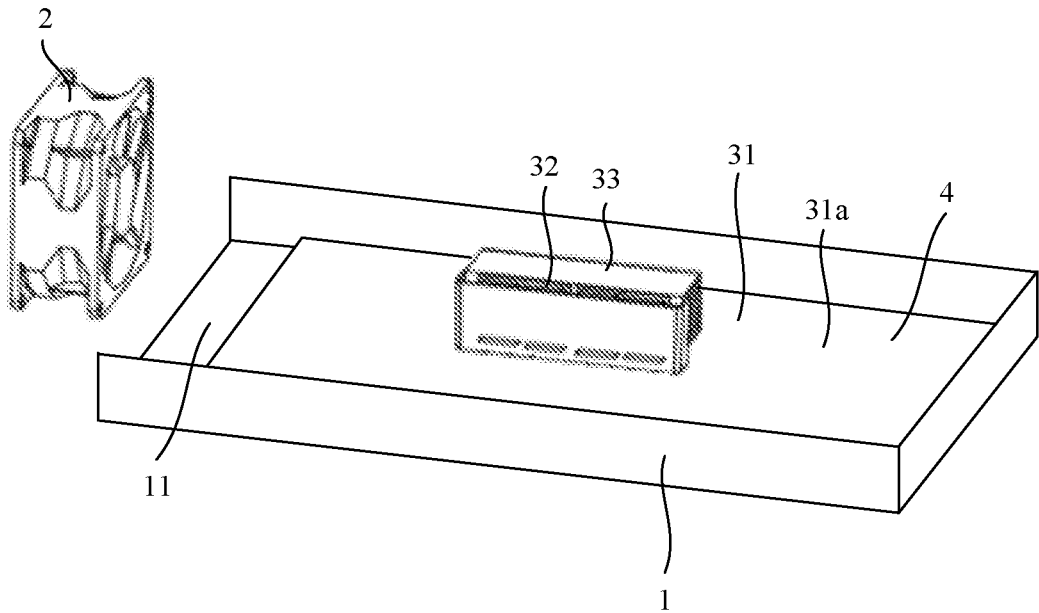
FIG. 43 is a schematic diagram of a structure of a second type of electronic device according to an embodiment of this application.
Figure 44:
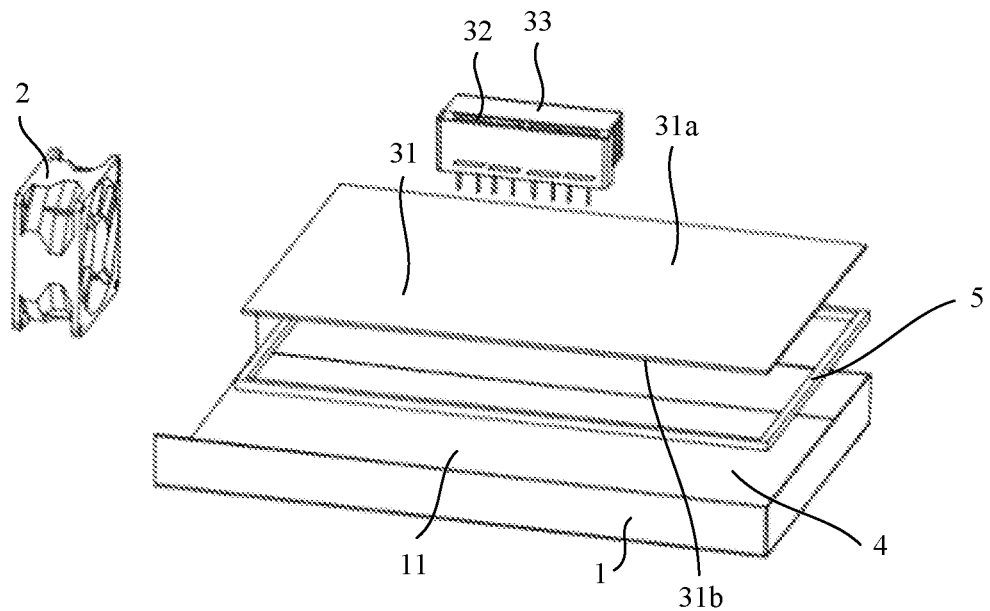
FIG. 44 is a first exploded view of the second type of electronic device according to an embodiment of this application.

In the foregoing five optional implementations, to protect an electronic component on the second surface 31b of the circuit board 31 from being corroded, as shown in FIG. 43 and FIG. 44, in some embodiments, a housing 1 includes a first side wall 11; and the second surface 31b of the circuit board 31 is opposite to the first side wall 11 of the housing 1, a sealing strip 5 is sandwiched between the second surface 31b of the circuit board 31 and the first side wall 11 of the housing 1, and the sealing strip 5 is disposed around an edge of the second surface 31b of the circuit board 31. In this way, the first side wall 11 of the housing 1, the sealing strip 5, and the second surface 31b of the circuit board 31 define a closed or semi-closed cavity to seal the electronic component on the second surface 31b of the circuit board 31 in the cavity, to protect the electronic component on the second surface 31b of the circuit board 31 from being corroded.

In the foregoing embodiments, it should be noted that the sealing strip 5 may be disposed around an edge of the second surface 31b of the circuit board 31, so that the first side wall 11 of the housing 1, the sealing strip 5, and the second surface 31b of the circuit board 31 define a closed cavity. Alternatively, the sealing strip 5 may be disposed around a partial edge of the second surface 31b of the circuit board 31, so that the first side wall 11 of the housing 1, the sealing strip 5, and the second surface 31b of the circuit board 31 define a semi-closed cavity. This is not specifically limited herein.

In some embodiments, as shown in FIG. 44, the sealing strip 5 is disposed around the edge of the second surface 31b of the circuit board 31. In this way, the first side wall 11 of the housing 1, the sealing strip 5, and the second surface 31b of the circuit board 31 define a closed cavity. Therefore, the electronic component on the second surface 31b of the circuit board 31 is effectively protected from being corroded.

Figure 45:
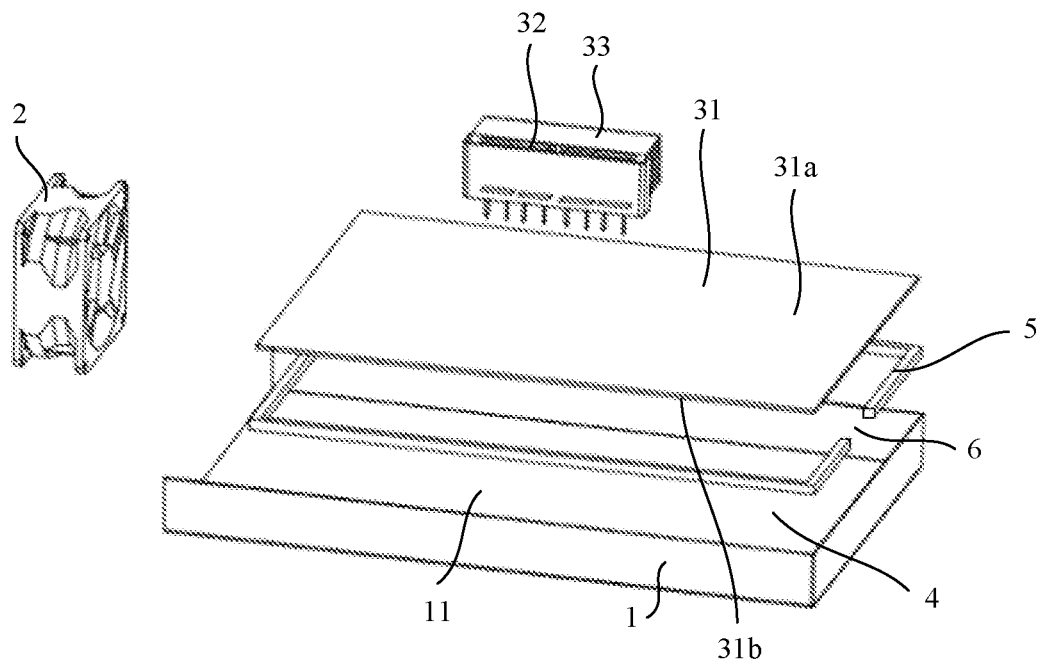
FIG. 45 is a second exploded view of the second type of electronic device according to an embodiment of this application.

In some other embodiments, as shown in FIG. 45, the sealing strip 5 is disposed around a partial edge of the second surface 31b of the circuit board 31, and there is a gap 6 between a head end and a tail end of the sealing strip 5. In this way, the first side wall 11 of the housing 1, the sealing strip 5, and the second surface 31b of the circuit board 31 define a semi-closed cavity to protect the electronic component on the second surface 31b of the circuit board 31 to some extent. In addition, air pressure inside and outside the semi-closed cavity can be balanced by using the gap 6, and heat dissipation of an electronic component in the cavity is facilitated.

In some embodiments, a surface of the cooling fan may be protected from being corroded by using a vacuum coating process or an adhesive filling process, to prolong a service life of the cooling fan and improve a protection capability of the cooling fan.

Figure 46:
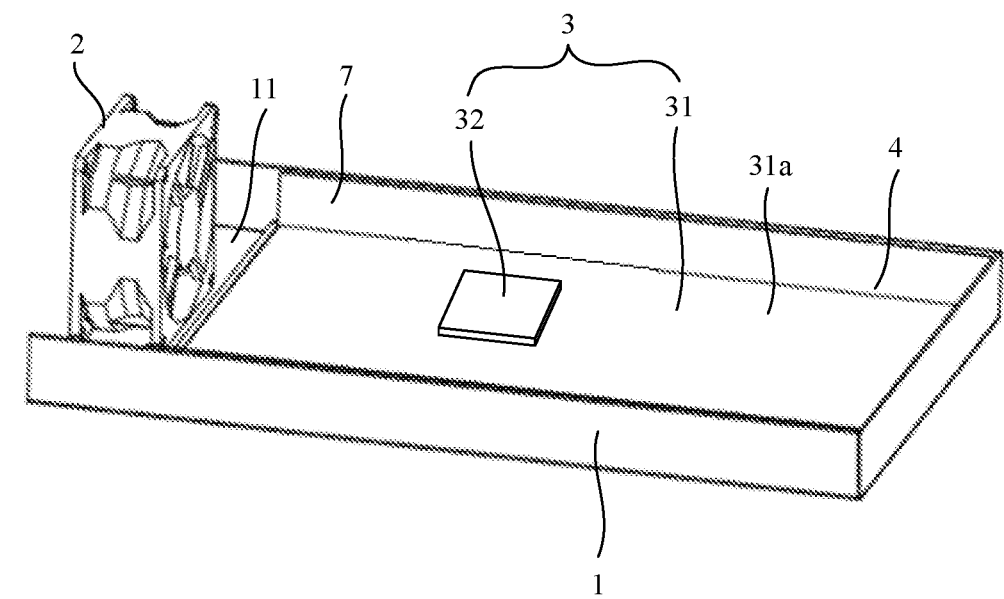
FIG. 46 is a schematic diagram of a structure of a third type of electronic device according to an embodiment of this application.

Second solution: FIG. 46 shows an electronic device according to some other embodiments of this application. The electronic device includes, but is not limited to, a charging pile and a wireless base station. As shown in FIG. 46, the electronic device includes a housing 1, a cooling fan 2, and a circuit board 3 with an electronic component: the housing 1 defines an air duct 4: the housing 1 includes a first side wall 11: the cooling fan 2 is disposed at one end of the air duct 4; and the circuit board 3 with an electronic component is disposed inside the air duct 4. During running of the cooling fan 2, the cooling fan 2 can blow cold air outside the electronic device into the air duct 4 to cool the circuit board 3 with an electronic component. The circuit board 3 with an electronic component includes a circuit board 31 and an electronic component 32 connected to the circuit board 31. The circuit board 31 includes a first surface 31a and a second surface 31b that deviate from each other. The second surface 31b of the circuit board 31 is opposed to the first side wall 11 of the housing 1. A sealing strip 5 is sandwiched between the second surface 31b of the circuit board 31 and the first side wall 11 of the housing 1, and the sealing strip 5 is disposed around an edge of the second surface 31b of the circuit board 31.

Compared with a conventional technology, because the sealing strip 5 is sandwiched between the second surface 31b of the circuit board 31 of the electronic device provided in embodiments of this application and the first side wall 11 of the housing 1, and the sealing strip 5 is disposed around the edge of the second surface 31b of the circuit board 31, the first side wall 11 of the housing 1, the sealing strip 5, and the second surface 31b of the circuit board 31 define a closed or semi-closed cavity. In this way, an electronic component on the second surface 31b of the circuit board 31 can be sealed in the cavity to protect the electronic component on the second surface 31b of the circuit board 31 from being corroded, thereby improving a protection level of the circuit board 3.

The housing 1 may be a metal housing, or may be a plastic housing. This is not specifically limited herein. In some embodiments, as shown in FIG. 46, the housing 1 is a metal housing, and the metal housing has relatively high structural strength, relatively high stability, and relatively excellent heat dissipation performance. This can prolong a service life of the electronic device, reduce maintenance costs, and improve heat dissipation performance of the circuit board 3 to some extent.

The cooling fan 2 includes, but is not limited to, an axial flow fan and a centrifugal fan.

In some embodiments, the circuit board 3 with an electronic component is a charging circuit board in a charging pile for charging a new energy electric vehicle.

It should be noted that, the sealing strip 5 may be disposed around an edge of the second surface 31b of the circuit board 31, so that the first side wall 11 of the housing 1, the sealing strip 5, and the second surface 31b of the circuit board 31 define a closed cavity. Alternatively, the sealing strip 5 may be disposed around a partial edge of the second surface 31b of the circuit board 31, so that the first side wall 11 of the housing 1, the sealing strip 5, and the second surface 31b of the circuit board 31 define a semi-closed cavity. This is not specifically limited herein.

Figure 47:
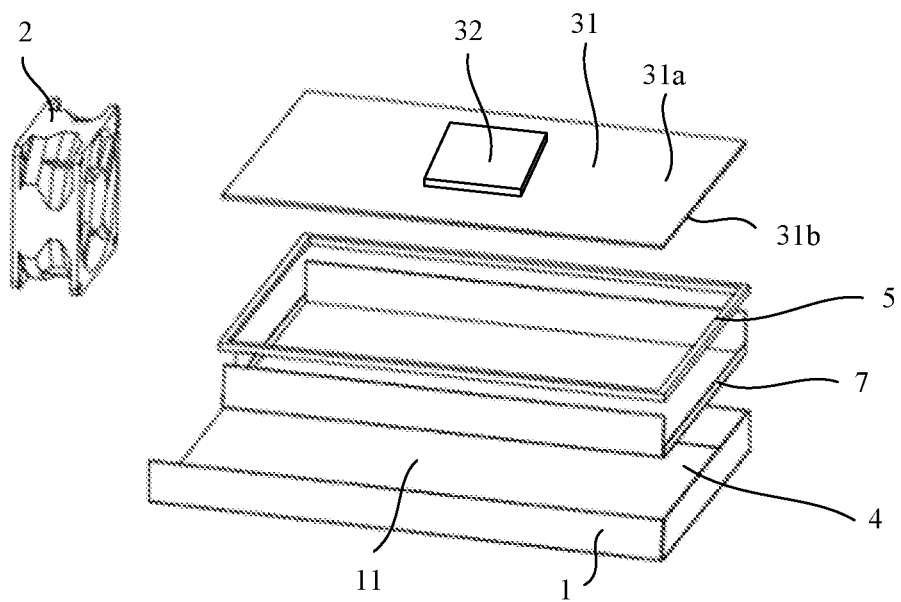
FIG. 47 is a first exploded view of the third type of electronic device according to an embodiment of this application.

In some embodiments, as shown in FIG. 47, the sealing strip 5 is disposed around the edge of the second surface 31b of the circuit board 31. In this way, the first side wall 11 of the housing 1, the sealing strip 5, and the second surface 31b of the circuit board 31 define a closed cavity. Therefore, the electronic component on the second surface 31b of the circuit board 31 is effectively protected from being corroded.

Figure 48:
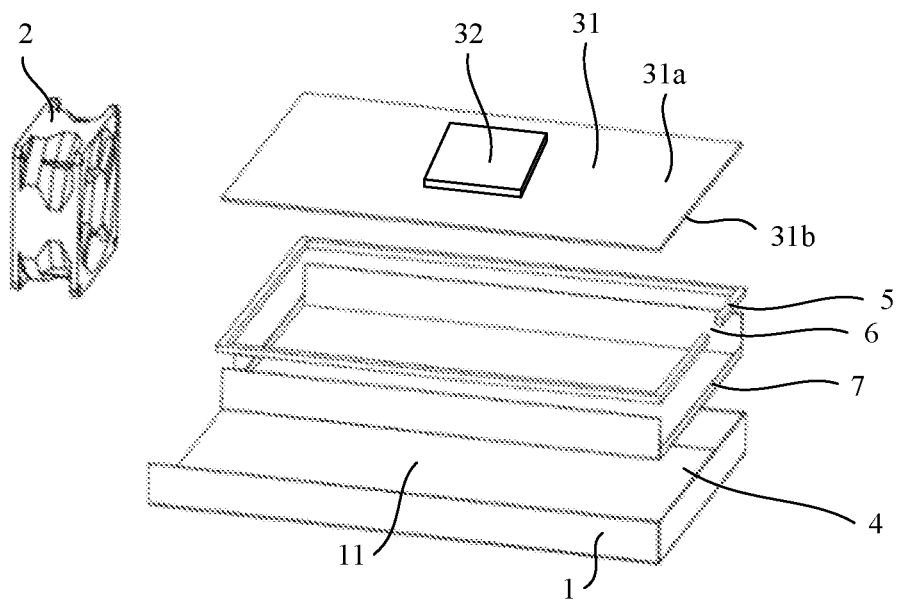
FIG. 48 is a second exploded view of the third type of electronic device according to an embodiment of this application.

In some other embodiments, as shown in FIG. 48, the sealing strip 5 is disposed around a partial edge of the second surface 31b of the circuit board 31, and there is a gap 6 between a head end and a tail end of the sealing strip 5. In this way, the first side wall 11 of the housing 1, the sealing strip 5, and the second surface 31b of the circuit board 31 define a semi-closed cavity to protect the electronic component on the second surface 31b of the circuit board 31 to some extent. In addition, air pressure inside and outside the semi-closed cavity can be balanced by using the gap 6, and heat dissipation of an electronic component in the cavity is facilitated.

The sealing strip 5 may be fastened to the housing 1 first, and then the housing 1 with the sealing strip 5 is fixedly connected to the circuit board 31. Alternatively, the sealing strip 5 may be fastened to the circuit board 31 first, and then the circuit board 31 with the sealing strip 5 is fixedly connected to the housing 1. This is not specifically limited herein.

On some circuit boards, electronic components are connected to first surfaces 31a of the circuit boards 31. To protect an electronic component on the first surface 31a of the circuit board 31 from being corroded, in some embodiments, as shown in FIG. 46, a first fence 7 is disposed around an edge of at least a partial region of the first surface 31a of the circuit board 31, the first fence 7 and the first surface 31a of the circuit board 31 define a groove, and the groove is filled with a sealant (not shown in the figure). In this way, the sealant in the groove can cover the electronic component on the first surface 31a of the circuit board 31 to protect the electronic component from being corroded.

The first fence 7 may be disposed around an edge of the entire first surface 31a of the circuit board 31, or may be disposed around an edge of a partial region of the first surface 31a of the circuit board 31. This is not specifically limited herein. In some embodiments, as shown in FIG. 46, the first fence 7 is disposed around the edge of the entire first surface 31a of the circuit board 31. In this way, all electronic components on the first surface 31a of the circuit board 31 can be protected from being corroded.

The first fence 7 may be a separately arranged insulating film or a separately arranged plastic part of an open mold, or may be a structure formed by folding an insulating film attached to the housing 1. This is not specifically limited herein.

There are plug-in connectors on some circuit boards, and these plug-in connectors are used for external connection of plug-ins. To prevent the sealant from overflowing into a jack of a plug-in connector during filling of the sealant in the groove inside the first fence 7, in some embodiments, a plug-in connector is disposed on the first surface 31a of the circuit board 31, and the plug-in connector is located inside the first fence 7. A second fence is disposed on the first surface 31a of the circuit board 31 and around the plug-in connector, the second fence is located inside the first fence 7, the first fence 7, the second fence, and the first surface 31a of the circuit board 31 define a first groove, the first groove is filled with the sealant, the second fence and the first surface 31a of the circuit board 31 define a second groove, and the second groove is not filled with the sealant. In this way, due to blocking by the second fence, the sealant is prevented from overflowing into a jack of the plug-in connector during filling of the sealant in the groove. After a plug-in is connected to the plug-in connector, the sealant can be filled in the second groove to seal a connection gap between the plug-in and the plug-in connector, to protect a metal conductive part in the connection gap between the plug-in and the plug-in connector from being corroded.

In some embodiments, a surface of the cooling fan may be protected from being corroded by using a vacuum coating process or an adhesive filling process, to prolong a service life of the cooling fan and improve a protection capability of the cooling fan.

In the descriptions of this specification, the described specific features, structures, materials, or characteristics may be combined in a proper manner in any one or more of embodiments or examples.

It will be appreciated that the foregoing embodiments are merely intended for describing exemplary technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of this application.

What is claimed is:

1. A system, comprising:
   an electronic component; and
   an enclosure frame;
   wherein the electronic component with the enclosure frame are connected to a circuit board and together define a cavity that has one open end;
   wherein the electronic component comprises an electronic component body and a pin;
   wherein at least a first end of the electronic component body is located inside the enclosure frame;
   wherein the electronic component body is fastened to the enclosure frame;
   wherein the pin extends out of the electronic component body from the first end of the electronic component body, and extends out of the enclosure frame from a first end of the enclosure frame;
   wherein a part of the pin is located in the enclosure frame between an end face of the first end of the electronic component body and an end face of the first end of the enclosure frame;
   wherein the enclosure frame comprises a plurality of side walls, the plurality of side walls define a cylindrical structure with two open ends opposite to each other, and a first open end of the cylindrical structure corresponds to the first end of the enclosure frame; and
   wherein the electronic component body is fastened to a side wall of the plurality of side walls, the end face of the first end of the electronic component body faces towards an opening in the first open end of the cylindrical structure, and the pin extends out of the electronic component body from the first end of the electronic component body and out of the enclosure frame from the opening in the first open end of the cylindrical structure.

2. The system according to claim 1, wherein the side a wall of the enclosure frame to which the electronic component body is fastened comprises a heat sink.

3. The system according to claim 2, wherein the heat sink comprises:
   one first heat dissipation plate, wherein the first heat dissipation plate has a first surface and a second surface that deviate from each other, and the electronic component body is fastened to the first surface of the first heat dissipation plate; and
   a plurality of second heat dissipation plates, wherein the plurality of second heat dissipation plates are thermally connected to the second surface of the first heat dissipation plate, and the plurality of second heat dissipation plates are stacked and are disposed at intervals.

4. The system according to claim 1, wherein the entire electronic component body is located inside the enclosure frame.

5. The system according to claim 1, further comprising:
a plurality of electronic components, wherein the plurality of electronic components comprise the electronic component and at least one second electronic component; and
wherein the plurality of side walls comprise the side wall and a second side wall, wherein the side wall and the second side wall are opposite to each other, and an electronic component body of the at least one second electronic component is fastened to the second side wall.

6. The system according to claim 5, wherein the electronic component and the at least one second electronic component are disposed in a staggered manner.

7. The system according to claim 1, wherein the enclosure frame comprises a top wall;
wherein the plurality of side walls are fastened to the top wall and disposed around an edge of the top wall;
wherein ends of the plurality of side walls that are away from the top wall define the opening in the first open end; and
wherein the entire electronic component body is located inside the enclosure frame.

8. The system according to claim 7, wherein the enclosure frame is filled with a sealant, and the sealant covers the electronic component body and the part of the pin that is located between the end face of the first end of the electronic component body and the end face of the first end of the enclosure frame.

9. The system according to claim 1, wherein the enclosure frame comprises a top wall;
wherein the plurality of side walls are fastened to the top wall and disposed around an edge of the top wall;
wherein ends of the plurality of side walls away from the top wall define the opening in the first open end;
wherein one end of the enclosure frame in a direction parallel to the top wall defines a second opening;
wherein the ends of the plurality of side walls away from the top wall correspond to the first end of the enclosure frame; and
wherein the entire electronic component body is located inside the enclosure frame.

10. The system according to claim 1, further comprising:
a plurality of electronic components;
wherein electronic component bodies of the plurality of electronic components are fastened to the side wall of the plurality of side walls, and pins of the plurality of electronic components all extend out of the enclosure frame from the first end of the enclosure frame.

11. The system according to claim 1, wherein a distance between the end face of the first end of the electronic component body and the end face of the first end of the enclosure frame is in the range of 3 to 10 mm.

12. The system according to claim 1, wherein the electronic component is a power transistor.

13. A system, comprising:
a circuit board; and
an electronic component with an enclosure frame;
wherein the electronic component with the enclosure frame are connected to the circuit board and together define a cavity that has one open end;
wherein the electronic component comprises an electronic component body and a pin;
wherein at least a first end of the electronic component body is located inside the enclosure frame;
wherein the electronic component body is fastened to the enclosure frame;
wherein the pin extends out of the electronic component body from the first end of the electronic component body, and extends out of the enclosure frame from a first end of the enclosure frame;
wherein a part of the pin is located in the enclosure frame between an end face of the first end of the electronic component body and an end face of the first end of the enclosure frame;
wherein the circuit board comprises:
a first surface and a second surface that deviate from each other,
a via, and
a pad disposed on the second surface of the circuit board, wherein the pad corresponds to the via;
wherein the enclosure frame and the electronic component body of the electronic component are located on the first surface of the circuit board and away from the second surface of the circuit board;
wherein the end face of the first end of the enclosure frame is attached and fastened to the first surface of the circuit board, and the pin of the electronic component is welded to the pad;
wherein the enclosure frame comprises a plurality of side walls, the plurality of side walls define a cylindrical structure with two open ends opposite to each other, and a first open end of the cylindrical structure corresponds to the first end of the enclosure frame; and
wherein the cavity is filled with a sealant, and the sealant covers at least the part of the pin located in the enclosure frame between the end face of the first end of the electronic component body and the end face of the first end of the enclosure frame.

14. The system according to claim 13, wherein the enclosure frame comprises a top wall:
wherein the plurality of side walls are fastened to the top wall and disposed around an edge of the top wall;
wherein ends of the plurality of side walls away from the top wall define a first opening;
wherein one end of the enclosure frame in a direction parallel to the top wall defines a second opening; and
wherein the ends of the plurality of side walls away from the top wall correspond to the first end of the enclosure frame.

15. The system according to claim 13, wherein the enclosure frame comprises a top wall;
wherein the plurality of side walls are fastened to the top wall and disposed around an edge of the top wall;
wherein ends of the plurality of side walls away from the top wall define a first opening;
wherein one end of the enclosure frame in a direction parallel to the top wall defines a second opening;
wherein the ends of the plurality of side walls away from the top wall correspond to the first end of the enclosure frame; and
wherein the system comprises an even number of electronic components each with a respective enclosure frame, wherein every two of the even number of electronic components form a pair of electronic components, and end faces of ends of enclosure frames of each pair of electronic components and at which second openings are defined are disposed opposite to each other in an attachment manner.

16. The system according to claim 13, wherein a first fence is disposed around an edge of at least a partial region of the first surface of the circuit board, the first fence and the first surface of the circuit board define a groove, and the groove is filled with the sealant.

17. The system according to claim 16, wherein a plug-in connector is disposed on the first surface of the circuit board, and the plug-in connector is located inside the first fence; and wherein a second fence is disposed on the first surface of the circuit board and around the plug-in connector, the second fence is located inside the first fence, the first fence, the second fence, and the first surface of the circuit board define a first groove, the first groove is filled with the sealant, the second fence and the first surface of the circuit board define a second groove, and the second groove is not filled with the sealant.

18. The system according to claim 13, wherein the circuit board with the electronic component is a charging circuit board in a charging pile for charging an electric vehicle.

\* \* \* \* \*

UNITED STATES PATENT AND TRADEMARK OFFICE
CERTIFICATE OF CORRECTION

Page 1 of 1

PATENT NO. : 12,127,328 B2
APPLICATION NO. : 17/747810
DATED : October 22, 2024
INVENTOR(S) : Liu et al.

It is certified that error appears in the above-identified patent and that said Letters Patent is hereby corrected as shown below:

In the Claims

Claim 2: Column 36, Line 50: "The system according to claim 1, wherein the side a" should read as -- The system according to claim 1, wherein the side --.

Claim 14: Column 38, Line 34: "sure frame comprises a top wall:" should read as -- sure frame comprises a top wall; --.

Claim 15: Column 38, Line 59: "ponents, and end faces of ends of enclosure frames of" should read as -- ponents, and end faces of ends that are of enclosure frames of --.

Signed and Sealed this
Twenty-seventh Day of May, 2025

Coke Morgan Stewart
*Acting Director of the United States Patent and Trademark Office*